United States Patent
Zuo et al.

(10) Patent No.: US 9,368,564 B2
(45) Date of Patent: Jun. 14, 2016

(54) 3D PILLAR INDUCTOR

(71) Applicant: QUALCOMM Incorporated, San Diego, CA (US)

(72) Inventors: Chengjie Zuo, Santee, CA (US); Jonghae Kim, San Diego, CA (US); Daeik Daniel Kim, San Diego, CA (US); Changhan Hobie Yun, San Diego, CA (US); Mario Francisco Velez, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/229,317

(22) Filed: Mar. 28, 2014

(65) Prior Publication Data

US 2015/0279920 A1 Oct. 1, 2015

(51) Int. Cl.
- H01L 21/48 (2006.01)
- H01L 49/02 (2006.01)
- H01F 17/00 (2006.01)

(52) U.S. Cl.
CPC ............ H01L 28/10 (2013.01); H01F 17/0013 (2013.01); H01L 21/4889 (2013.01); *H01F 2017/002* (2013.01)

(58) Field of Classification Search
CPC .......... H01L 2224/48227; H01L 2224/13111; H01L 2224/73265; H01L 2224/73204; H01L 2924/00; H01L 49/02; H01L 21/48; H01L 28/10

USPC .......................... 257/531, 758, 778, 774, 777
See application file for complete search history.

(56) References Cited

U.S. PATENT DOCUMENTS

| | | | |
|---|---|---|---|
| 5,461,353 A | 10/1995 | Eberhardt | |
| 6,531,945 B1 | 3/2003 | Ahn et al. | |
| 7,518,248 B2 | 4/2009 | Li et al. | |
| 8,384,507 B2 | 2/2013 | Li et al. | |
| 2004/0124961 A1 | 7/2004 | Aoyagi | |
| 2007/0085648 A1 | 4/2007 | Lee et al. | |
| 2010/0225434 A1 | 9/2010 | Wang et al. | |
| 2011/0101497 A1* | 5/2011 | Bizen et al. | 257/531 |
| 2011/0234357 A1 | 9/2011 | Kim et al. | |
| 2013/0293336 A1 | 11/2013 | Lo et al. | |

OTHER PUBLICATIONS

International Search Report and Written Opinion—PCT/US2015/021655—ISA/EPO—Aug. 7, 2015.

* cited by examiner

*Primary Examiner* — Chuong A Luu
*Assistant Examiner* — Rodolfo Fortich
(74) *Attorney, Agent, or Firm* — Muncy, Geissler, Olds & Lowe, P.C.

(57) ABSTRACT

Base pads are spaced by a pitch on a support surface. Conducting members, optionally Cu or other metal pillars, extend up from the base pads to top pads. A top pad interconnector connects the top pads in a configuration establishing an inductor current path between the base pads.

23 Claims, 11 Drawing Sheets

3D PILLAR INDUCTOR

FIELD OF DISCLOSURE

The present application is generally related to inductors and radiating elements within integrated circuit devices.

BACKGROUND

Inductors can be formed or installed on integrated circuit (IC) chips for various applications. Examples include inductors in series with power rails to filter current "spikes," e.g., from rapid switching of loads, and "LC" filters comprising various interconnects of inductors and capacitors.

One known IC chip inductor structure is the planar "zig-zag" or "meander line" (hereinafter "meander") inductor. FIG. 1 shows one conventional planar meander inductor 100, formed of a meander conductor 102 extending on the top plane of a substrate 104. However, conventional planar meander inductors as shown in FIG. 1 can have certain shortcomings. One can be area, i.e., the product of L1 and W1, the meander conductor 102 occupies on the surface of the substrate 104. Another shortcoming can be a low value of its quality factor, Q, which is the ratio of the reactance, ($\omega \times L$), to the real resistance, R, due in part to the dielectric properties of the substrate 104. The lower than preferred Q can have negative effects such as power consumption, which can reduce battery life and generate heat and, in applications such as LC filters, can reduce performance.

Another known IC chip inductor structure is a three-dimensional ("3D") structure known as a "through-glass-via" or "TGV" 3D inductor, such as the TGV 3D inductor 200 shown by FIGS. 2A and 2B. FIG. 2A is a top view, from a direction normal to the top surface 202A of a glass substrate 202. FIG. 2B is a cross-cut projection view from the FIG. 2A cutting plane 1-1. Referring to FIGS. 2A and 2B, the TGV 3D inductor 200 employs through glass vias (TGVs) 204 as vertical segments, and top and bottom traces 206 and 208, respectively, as horizontal segments.

The TGV 3D inductor 200 can have, in some applications, a higher Q and higher inductance compared to a comparable FIG. 1 conventional planar meander inductor 100. However, the related art TGV 3D inductor 200 can have certain shortcomings. One shortcoming is that the minimum pitch (i.e., TGV-to-TGV spacing), shown as P1 and P2 on FIGS. 2A and 2B, may be larger than desired, due to fundamental aspects of TGV technology. As a result, the TGV 3D inductor 200 often occupies a larger area or volume than preferred.

Accordingly, there is a need for a high Q, low surface area IC chip inductor.

SUMMARY

Various exemplary embodiments can also provide inductor structures having features and benefits that can include, but are not limited to, higher inductance per unit area, or per unit volume, and higher Q, ease of fabrication and compatibility with known conventional IC design and fabrication techniques.

Example three-dimensional (3D) inductors in accordance with various exemplary embodiments may include a first base pad and a second base pad, spaced by a pitch. The first base pad and the second base pad may be arranged on a given base pad support surface. A first conducting member may be arranged, having a base aligned with and coupled to the first base pad, and having a top at a height above the first base pad. In an aspect, a second conducting member may have a base aligned with and coupled to the second base pad, and a top at the height above the second base pad. In an aspect, a first top pad may be arranged on a given top pad support surface above and facing the given base pad support surface, aligned with the first base pad and coupled to the top of the first conducting member. In a related aspect, a second top pad may be arranged on the given top pad support surface, aligned with the second base pad and coupled to the top of the second conducting member. In an aspect, a top pad interconnector may be formed on the given top pad support surface, coupling the first top pad to the second top pad.

In an aspect, the first conducting member, the first top pad, the top pad interconnector, the second top pad, and the second conducting members may be arranged to establish a meander current path, from the first base pad to the second base pad, within a reference plane normal to a plane of the given base pad support surface.

In a further aspect, the height and pitch of the first conducting member, the second conducting member, the third conducting member and the fourth conducting member may be configured wherein the meander current path establishes an inductor approximating a meander inductor, having four arms. The arm length of the approximated meander inductor may correspond to the height. The arm spacing may correspond to the pitch. The first base pad may be a first terminal and the second base pad may be a second terminal.

Example three-dimensional (3D) inductors in accordance with various exemplary embodiments may include a first row of conducting members and a second row of conducting members. The conducting members may each extending a height from a corresponding base pad on a given base pad support surface up to a corresponding top pad. The corresponding top pad may be on a given top pad support surface facing the given base pad support surface. In an aspect, the first row of conducting members and the second row of conducting members may be arranged parallel to, and on opposite sides of, a given winding axis. The given winding axis may be parallel to and between the given base pad support surface and the given top pad support surface. The base cross-connector may connect a base pad of a first conducting member in the first row, under the given winding axis, to a base pad of a first conducting member in the second row. In a further aspect, an adjacent turn link may extend from a top pad of the first conducting member in the second row, over the winding axis, to the top pad of a second conducting member in the first row, adjacent the first conducting member in the first row.

Example methods in accordance with various exemplary embodiments may provide a forming of a 3D inductor, and may include fabricating an inductor lower sub-assembly, fabricating an inductor top sub-assembly, and assembling the sub-assemblies. In an aspect, forming an inductor lower sub-assembly may include forming a first base pad and a second base pad, spaced by a pitch, on a given base pad support surface of a substrate, in addition to forming a first conducting member having a base aligned with and coupled to the first base pad. In an aspect, the first conducting member may have a top at a height above the first base pad. Methods may also include forming a second conducting member having a base aligned with and coupled to the second base pad, and a top at the height above the second base pad. In accordance with various exemplary embodiments, fabricating an inductor top sub-assembly may include forming, on a given top pad support surface of a given top support structure, a first top pad and a second top pad, spaced by the pitch. Methods may further include forming a top pad interconnector on the given top pad support surface, coupling the first top pad to the second top pad. Example methods may further include assembling the inductor top sub-assembly to the inductor lower sub-assembly to form the 3D inductor. In an aspect, the assembling may include aligning and coupling the first top pad and the second top pad, respectively, with the top of the first conducting member and the top of the second conducting member.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
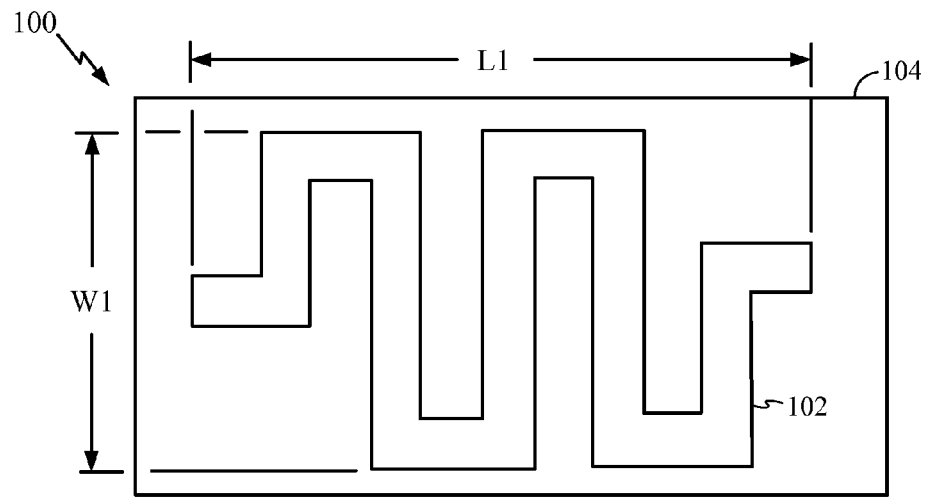
FIG. 1 is a plan view of a related art planar meander inductor.
Figure 2A:
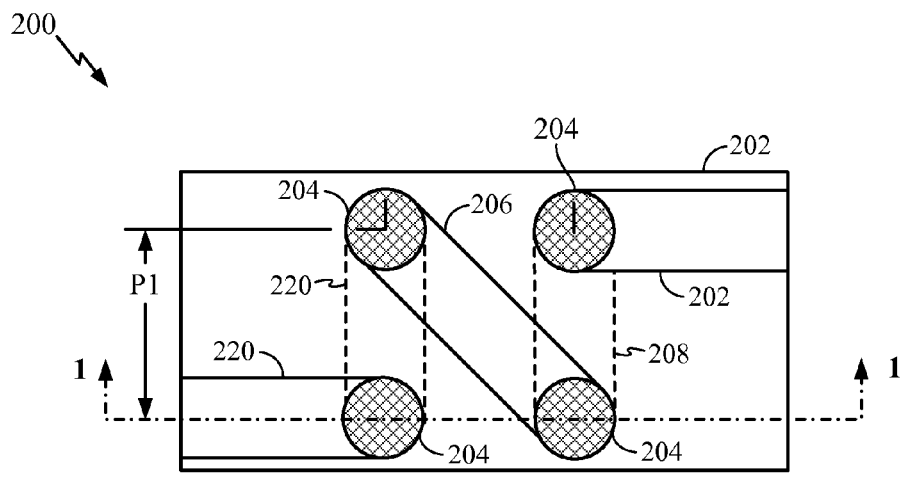
FIG. 2A is a top view of a related art TGV inductor.
Figure 2B:
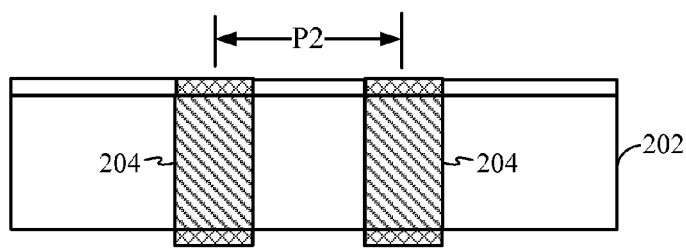
FIG. 2B is a projection, on the 1-1 cut plane, of the FIG. 2A related art TGV inductor.

Aspects of the invention are disclosed in the following description and related drawings directed to specific exemplary embodiments. Alternate embodiments may be devised without departing from the scope of the invention. In certain described example implementations, instances are identified where various component structures and portions of operations can be taken from known, conventional techniques, and then arranged in accordance with one or more exemplary embodiments. In such instances, internal details of the known, conventional component structures and/or portions of operations are omitted to help avoid potential obfuscation of inventive concepts.

The terminology used herein is only for the purpose of describing particular embodiments and is not intended to be limiting of embodiments of the invention.

The word "exemplary," as used herein, means "serving as an example, instance, or illustration." Accordingly, the term "exemplary embodiment," as used herein, means an embodiment serving as an example, instance, or illustration, but that is not necessarily preferred or advantageous over other embodiments. Likewise, it will be understood that the term "embodiments of the invention," as used herein in reference to a feature, advantage or mode of operation, does not mean that all embodiments of the invention include the discussed feature, advantage or mode of operation.

As used herein, the singular forms "a", "an" and "the" are intended to include the plural forms as well, unless the context clearly indicates otherwise. The terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Certain embodiments are described in terms of operations and steps, for example, in or relating to various processes of design and fabrication. It will be understood, that except in instances where explicitly stated or where made clear from a particular context, that the described order of such operations and steps is only for purposes of example, and is not necessarily limiting of the order of operations or steps that may be applied in practices according to various exemplary embodiments Further, certain embodiments are described in terms of operations, steps, actions and sequences of operations, steps and actions that can performed by or under control of, for example, a computing device or elements of a computing device. It will be understood by persons of ordinary skill, upon reading this disclosure, that such operations, steps, actions, sequences and other combinations therefore can be performed by, or under control of specific circuits (e.g., application specific integrated circuits (ASICs)), by program instructions being executed by one or more processors, or by a combination of both.

Accordingly, it will be appreciated by such persons that operations, steps, actions, sequences and other combinations thereof can be embodied entirely within any form of computer readable storage medium having stored therein a corresponding set of computer instructions that, upon execution, can cause an associated processor to perform, directly or indirectly, operations, steps, actions, sequences and other combinations described herein. Thus, the various aspects of the invention may be embodied in a number of different forms, all of which are contemplated to be within the scope of the claimed subject matter.

Throughout this disclosure, the term "pad" means a conducting structure disposed on a described surface, having a thickness within a range including, but not limited to, the range of thickness encompassed by structures within the ordinary and customary meaning of "pad" within the integrated circuit (IC) and IC packaging arts.

The term "conducting member" means, as used throughout this disclosure, a conducting structure, e.g., a conducting pillar, post, or ball, having a base or bottom surface aligned with and coupled to, or configured to be aligned with and coupled to, a corresponding "base pad," and having a top surface spaced a "height" above the base, aligned with and coupled to, or configured to be aligned with and coupled to a corresponding pad designated a "top pad."

One example three-dimensional (3D) inductor according to various exemplary embodiments includes a first base pad and a second base pad, spaced from one another by a pitch, disposed on a given base pad support surface. The given base pad support surface may, for example, be an assigned top surface area of a given lower or base substrate. In an aspect, a first conducting member (e.g., a metal pillar, post or solder ball) may be aligned with and coupled to the first base pad, and a second conducting member may be aligned with and coupled to the second base pad. In a further aspect, a top of the first conducting member may be coupled to a first top pad on a given top pad support surface, which may be spaced above and facing the base pad support surface. The first top pad may be above and aligned with the first base pad. In a further aspect, a top of the second conducting member may be coupled to a second top pad on the given top pad support surface, and the second top pad may be above and aligned with the second base pad. A top pad interconnector, on the top pad support surface, may couple the first top pad to the second top pad.

In an aspect, the first conducting member, the first top pad, the top pad interconnector, the second top pad and the second conducting member may establish a meander current path within a plan normal to the given base pad support surface.

As will be appreciated by persons of ordinary skill in the art to which exemplary embodiments pertain, the height and pitch of the first conducting member and the second conducting member may be configured wherein the meander current path approximates a meander inductor having two arms. The arm length of the approximated meander inductor may correspond to the height, and the arm spacing may correspond to the pitch. In an aspect, the first base pad may be a first terminal and the second base pad may be a second terminal.

In one example, the given top pad support surface may itself be a bottom surface of another substrate above the base or lower substrate. For example, without limitation, one given top pad support surface may be a bottom surface a substrate supporting, on its top surface, an IC chip in a flip-chip configuration. As another example, without limitation, one given top pad support surface may be an active chip surface of an IC chip supported in a flip-chip configuration by the given base or lower substrate.

In an aspect, in example 3D inductors according to various exemplary embodiments, each of the conducting members may be a metal pillar. For example, the first conducting member may be a metal first pillar, and the second conducting member may be a metal second pillar. As a more particular example, the first conducting member may be a first copper (Cu) pillar and the second conducting member may be a second Cu pillar.

In an aspect, the top pad interconnector may be a first top pad interconnector, and the 3D inductor may further comprise a third base pad and a fourth base pad on the given base pad support surface. In a further aspect, the first base pad, the second base pad, the third base pad and the fourth base pad may be aligned along a linear axis and spaced from one another by the pitch.

In another aspect, a base pad interconnector may be provided on the given base pad support surface coupling the first base pad and the second base pad. In combination, a third conducting member may be aligned with and coupled to the third base pad, and a fourth conducting member aligned with and coupled to the fourth base pad. The third conducting member and the fourth conducting member may have the same height as the first conducting member and the second conducting member. In another aspect, a third top pad and a fourth top pad may be disposed on the given top pad support surface. The third top pad may be aligned with and coupled to a top of the third conducting member, and the fourth top pad may be aligned with and coupled to a top of the fourth conducting member. In an aspect, a second top pad interconnector may be supported on the given top pad support surface, coupling the third top pad to the fourth top pad.

In an aspect, the first conducting member, the first top pad, the first top pad interconnector, the second top pad and the second conducting member, the second base pad, the base pad interconnector, the third base pad, the third conducting member, the third top pad, the fourth top pad, and the fourth conducting member may establish a meander current path. In an aspect, the established meander current path may be within a plane normal to the given base pad support surface, from the first base pad to the fourth base pad.

As will be appreciated by persons of ordinary skill in the art from reading this disclosure, the height and pitch of the first conducting member, the second conducting member, the third conducting member and the fourth conducting member may be configured wherein the meander current path establishes an inductor approximating a meander inductor having four arms. The approximated meander inductor may have an arm length corresponding to the height and an arm spacing corresponding to the pitch. The first base pad may be a first terminal and the fourth base pad may be a second terminal.

Figure 3A:
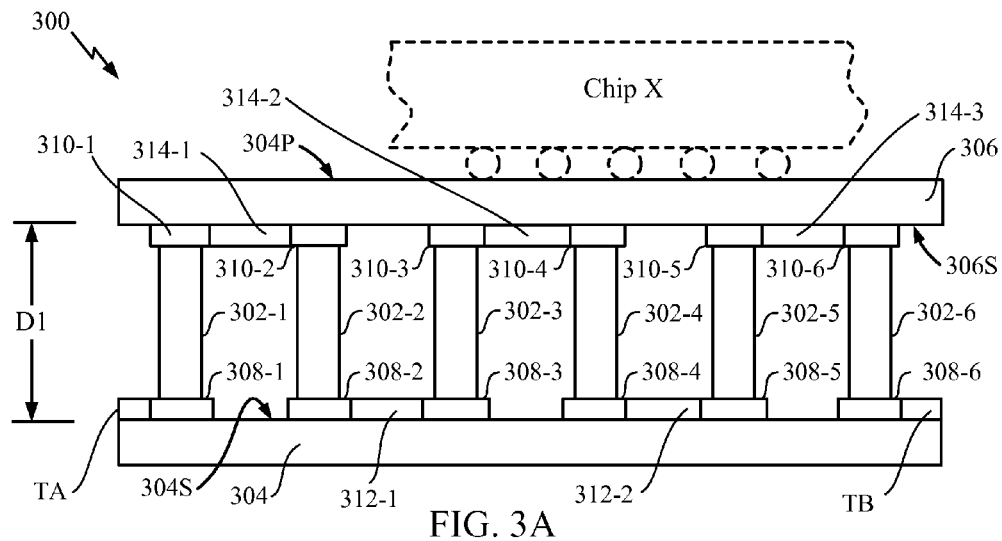
FIG. 3A is a front view of a three-dimensional (3D) pillar meander inductor according to one or more exemplary embodiments, viewed from a projection parallel to an extending plane of the Cu pillar arms.
Figure 3B:
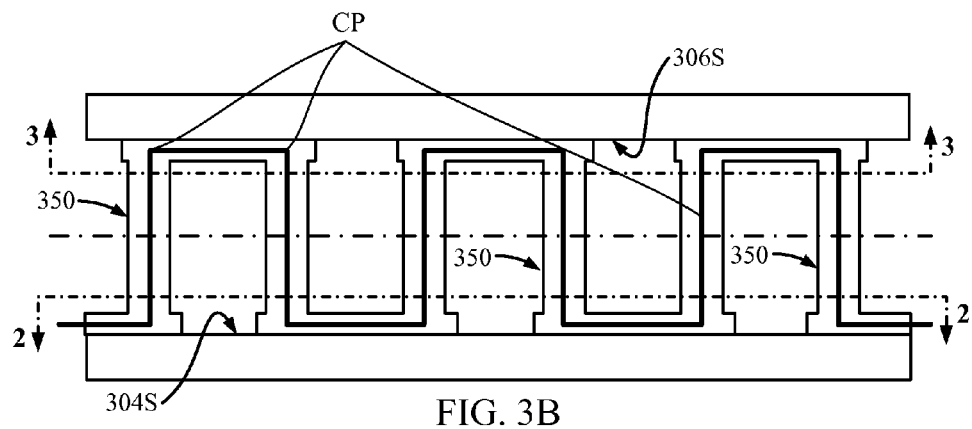
FIG. 3B is an annotation of FIG. 3A, showing a meander inductor current path through established by the 3D pillar meander inductor.

FIG. 3A shows a front view of one 3D pillar inductor structure 300 according to one exemplary embodiment. As shown by FIG. 3B, the 3D pillar inductor structure 300 provides a 3D pillar meander inductor 350 that, according to one exemplary embodiment, establishes a meander current path CP. In an aspect, the meander inductor 350 includes six arms, each formed, respectively, by one of the example metal pillars 302-1, 302-2 . . . 302-6 (collectively "metal pillars 302"). The metal pillars 302 may extend a pillar height D1 from a base pad support surface 304S of a lower substrate 304 up to a top pad support surface 306S of a top support structure 306. It will be understood that terms such as "lower" and "upper" refer to a top-to-bottom order on the sheet of FIGS. 3A-3B, and pillar "height" means extension from the base pad support surface 304S, and these are not necessarily related to orientation within a larger reference frame (e.g., earth). It will be appreciated that the meander current path CP is within a plane normal to the base pad support surface 304S.

Figure 4A:
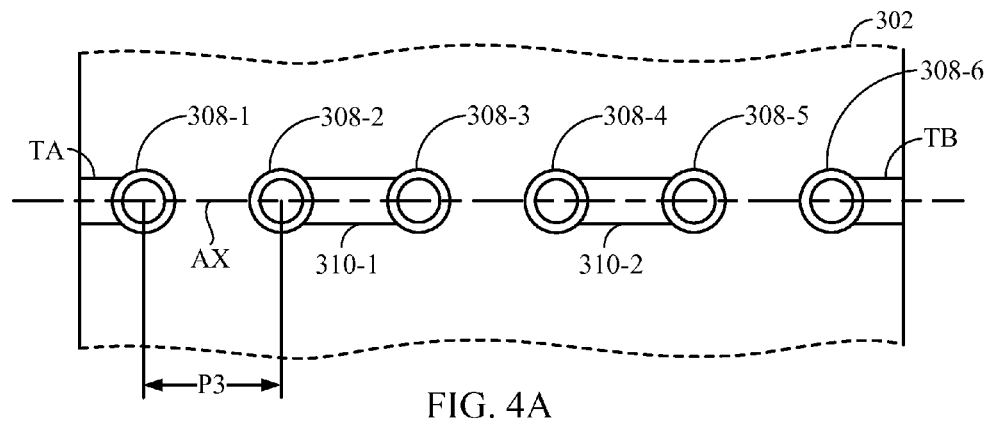
FIG. 4A is a projection, on the FIG. 3A cutting plane 3-3, showing an example alignment and pitch of the Cu pillars of the 3D pillar meander inductor and their respective pillar base interconnectors according to one example] pillar base interconnection pattern.
Figure 4B:
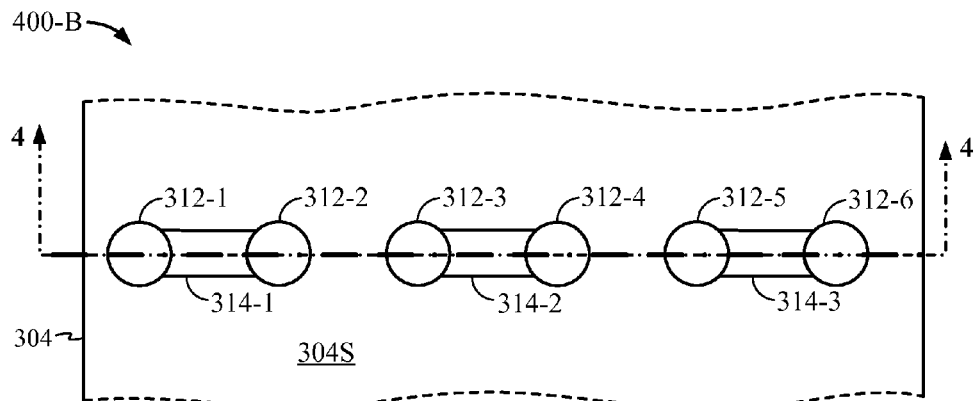
FIG. 4B is a projection, on the FIG. 3A cutting plane 4-4, showing Cu pillar top pads of the 3D pillar inductor, and their respective pillar top interconnectors according to one example pillar top connection pattern.

FIG. 4A is a plan view, from the FIG. 3B projection 2-2, showing the pitch P3 and arrangement of the metal pillars 302 on the base pad support surface 304S and their particular interconnections. FIG. 4B is a plan view, from the FIG. 3B projection 3-3, showing particular interconnection of the tops of the metal pillars 302 on the top pad support surface 306S of the top support structure 306. In describing example aspects of the 3D pillar inductor structure 300, the metal pillars 302-1, 302-2 . . . 302-6 may be referred to, individually, as a metal first pillar 302-1, a metal second pillar 302-2, a metal third pillar 302-3, a metal fourth pillar 302-4, a metal fifth pillar 302-5 and a metal sixth pillar 302-6.

In an aspect, the metal pillars 302 may be formed of copper (Cu). Subsequent description of examples using Cu for the conductive pillars 302 will, for brevity, refer to the metal pillars 302 as "Cu pillars" 302. In describing example aspects of the 3D pillar inductor structure 300 using Cu pillars 302, the Cu pillars 302 may be referred to, individually, as a first Cu pillar 302-1, a second Cu pillar 302-2, a third Cu pillar 302-3, a fourth Cu pillar 302-4, a fifth Cu pillar 302-5 and a sixth Cu pillar 302-6. Description referring to Cu pillars 302, however, is not intended to limit the exemplary embodiments to metal pillars 302 formed of Cu. On the contrary, exemplary embodiments contemplate metal pillar 302 of alternative high conductance metals such as, without limitation, aluminum (Al) and various copper alloys. In addition, persons of ordinary skill in the art, upon reading this disclosure, can adapt description referring to Cu pillars 302 to practices of the exemplary embodiments using alternative metals, such as Al, without undue experimentation.

Referring to FIG. 4A, on the base pad support surface 304S of the lower substrate 304 may be a linear arrangement, along the axis AX, of base pads 308-1, 308-2 . . . 308-6 (collectively "base pads 308") equally spaced by pitch P3. Each of the base pads supports a corresponding one of the Cu pillars 302. In describing example aspects of the 3D pillar inductor structure 300, base pads 308-1, 308-2 . . . 308-6 may be referred to, individually, as a first base pad 308-1, a second base pad 308-2, a third base pad 308-3, a fourth base pad 308-4, a fifth base pad 308-5 and a sixth base pad 308-6.

A first terminal TA can connect to the first base pad 308-1 and a second terminal TB can connect to the sixth base pad 308-6. The first and second terminals TA and TB are not necessarily specifically structured as terminals. For example, "TA" and "TB" may simply be reference names applied to the first base pad 308-1 and sixth base pad 308-6, respectively. In addition, the first and second terminals TA and TB are both on the base pad support surface 304S because the example quantity of metal pillars 302, which is six, is even. It will be understood that if an odd number of metal pillars 302 is selected, one of the first and second terminals TA and TB may be on the supporting surface 304A and the other on the top pad support surface 306S.

Referring still to FIG. 4A, also on the base pad support surface 304S a base pad first interconnector 310-1 can connect the second base pad 308-2 to the third base pad 308-3. Similarly, a base pad second interconnector 310-2 can connect the fourth base pad 308-4 to the fifth base pad 308-5. The base pad first interconnector 310-1 and the base pad second interconnector 310-2 will be collectively referred to as "base pad interconnectors 310." The base pad interconnectors 310 may be formed, for example, of Cu or another good conducting metal. The above-described pattern by which the base pad interconnectors 310 connect the base pads 308 can be referred to as a "base pad interconnection pattern."

FIG. 4B is a plan view from the FIG. 3B cut plane 3-3 of the top pad support surface 306S, showing six pillar top pads, 312-1, 312-2 . . . 312-6 (collectively "top pads" 312), arranged along axis AX' in alignment with base pads 308. In describing example aspects of the 3D pillar inductor structure 300, top pads 312-1, 312-2 . . . 312-6 may be referred to, individually, as a first top pad 312-1, a second top pad 12-2, a third top pad 312-3, a fourth top pad 312-4, a fifth top pad 312-5 and a sixth top pad 312-6. A top pad first interconnector 314-1 connects the first top pad 312-2 to the second top pad 312-2. A top pad second interconnector 314-2 connects the third top pad 312-3 to the fourth top pad 312-4, and a top pad third interconnector 314-3 connects the fifth top pad 312-5 to the sixth top pad 312-6. The top pad first interconnector 314-1, top pad second interconnector 314-2 and top pad third interconnector 314-3 will be collectively referred to as "top pad interconnectors 314." The top pad interconnectors 314 may be formed, for example, of Cu or another good conducting metal. The above-described pattern by which the top pad interconnectors 314 connect the top pads 312 can be referred to as a "top pad interconnection pattern."

Referring to FIGS. 3A-3B, the above-described arrangement of the metal pillars 302, with their base pads 308 interconnected in the described base pad interconnection pattern, and their top pads 312 interconnected in the described top pad interconnection pattern, provides the meander inductor 350 with the meander current path CP. As previously described, the meander current path CP may be within a plane normal to the base pad support surface 304S. In an aspect, the height D1 of the metal pillars 302 and the pitch P3 may be configured wherein the meander current path CP establishes an inductor approximating a meander inductor having six arms. The arm length of the approximated meander inductor may correspond to D1 and the arm spacing may correspond to P3. The first base pad 308-1 may be a first terminal and the sixth base pad 308-6 may be a second terminal.

The above-described 3D pillar meander inductor 350 shows its metal pillars 302 arranged along the linear axis AX. This is only one example, and is not intended as a limitation on any of the exemplary embodiments. Additional aspects having metal pillars and other conducting members arranged over an X-Y area, for example, to form a 3D coil inductor, are described later in this disclosure.

Referring again to FIG. 4A, the metal pillars 302 are shown equally spaced, by pitch P3. This is only for purposes of example. In one alternative aspect, the metal pillars 302 may be unequally spaced (not explicitly shown in the figures). Further, the metal pillars 302 are shown with a circular cross-section. The circular cross-section, though, is only an example and not a limitation.

Regarding the top support structure 306, FIG. 3A shows it as a substrate that supports, in a flip-chip arrangement, an IC chip arbitrarily labeled "Chip X." It will be understood that the top supporting structure 306 is only one example. Practices according to various embodiments include, for example, using a surface of an integrated circuit chip, such as "Chip X" to perform the described functions of the top pad support surface 306S.

Referring to FIGS. 3A-3B and 4A-4B, the quantity of six metal pillars 302 is only for purposes of example, and is not intended to limit the quantity of metal pillars 302 that exemplary embodiments may comprise. For example, as will be understood from reading this disclosure in its entirety, structures in accordance with FIGS. 3A-3B can be implemented having only three or less metal pillars 302 or, for example, seven or more metal pillars 302.

Referring to FIG. 3B, in an aspect, a distributed space (shown but not separately labeled) may exist between the metal pillars 302, spanning from the base pad supporting surface 304S of the lower substrate 304 up to the top pad supporting surface 306S of the top support structure 306. In an aspect, this distributed space may be filled, for example, with air. In a further aspect, the distributed space may be filled with a low-loss dielectric material. In another aspect, the distributed space may be filled with magnetic materials.

It will be understood that 3D meander inductors according to the exemplary embodiments can consist of fewer turns than shown by the example 3D pillar meander inductor 350. For example, a "one turn" (not separately labeled in the figures) 3D pillar meander inductor can be implemented using only the metal first pillar 302-1, metal second pillar 302-2, and top pad first interconnector 314-1. One terminal of this "one-turn" 3D meander inductor can be the inductor first terminal lead TA (or the first base pad 308-1), and the other can be the second base pad 308-2. In this example, the metal first pillar 302-1, the first top pad 312-1, the first top pad interconnector 314-1, and the metal second pillar 302-2 may form a meander current path (visible in FIG. 3B, but not separately labeled). This one-turn example is only one implementation. Persons of ordinary skill in the art having possession of this disclosure can readily identify, within the 3D pillar meander inductor 350, other of its constituent structures that may be used as a one-turn 3D pillar meander inductor. In addition, it may become apparent to such persons upon reading this disclosure that the 3D pillar meander inductor 350 may be supplemented with additional metal pillars (not explicitly shown in FIGS. 3A-3B or FIGS. 4A-4B), and corresponding additional pillar top pad interconnectors and pillar base pad interconnectors, in general patterns as disclosed.

Example operations in an illustrative process for fabricating 3D pillar meander inductors according to various exemplary embodiments will now be described in greater detail.

Figure 5A:
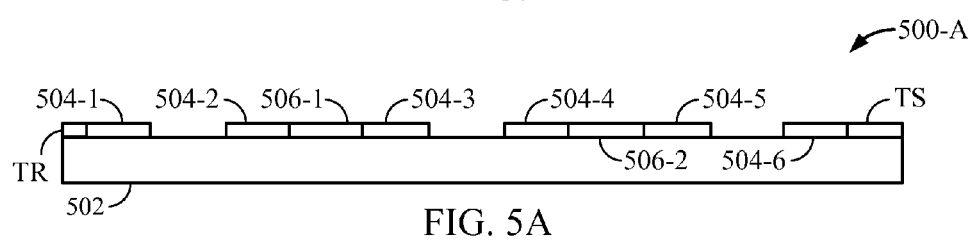
FIGS. 5A-5H show, from the FIG. 3A front view, one snapshot sequence of example operations in one process of fabricating, on a lower substrate, a 3D pillar meander inductor lower sub-assembly for subsequent assembly with a corresponding 3D pillar meander inductor top sub-assembly to one or more exemplary embodiments.

Referring to FIG. 5A, one starting structure 500-A can comprise a lower substrate 502 having a supporting surface 502S. The lower substrate 502 may be, in example implementations, a region or portion of a larger lower substrate (not fully visible in FIG. 5A).

The starting structure 500-A will be described assuming it is configured for fabricating the FIGS. 3A-3B and 4A-4B pillar inductor structure 300, to focus on concepts without possible obfuscation by description of another example structure implementation. Accordingly, for this example, the starting structure 500-A has, on the supporting surface 502S, six base pads 504-1, 504-2 . . . 504-6 (collectively "base pads" 504) arranged along a linear alignment axis (not visible in FIG. 5A). The linear alignment axis may be for example, the FIG. 4A AX. In an aspect, the base pads 504 may be spaced by a pitch (shown but not separately labeled) that is assumed as P3. In describing example aspects, base pads 504 may be referred to, individually, as first base pad 504-1, second base pad 504-2, third base pad 504-3, fourth base pad 504-4, fifth base pad 504-5 and sixth base pad 504-6.

Also on the supporting surface 502S of the lower substrate 502, base pad first interconnector 506-1 is configured to connect the second base pad 504-2 to the third base pad 504-3, and a base pad second interconnector 506-2 is configured to connect the fourth base pad 504-4 to the fifth base pad 504-5. This arrangement of the base pad first interconnector 506-1 and base pad second interconnector 506-2 therefore connects the base pads 504 according to the base pad interconnection pattern described for the lower FIG. 3A-3B base pads 308. A conductor labeled "TR," shown on the support surface 502S as connected to the first base pad 504-1, may be included as a first terminal. A conductor labeled "TS," also shown on the support surface 502S as connected to the base pad 504-6, may be included as a second terminal.

Figure 5B:
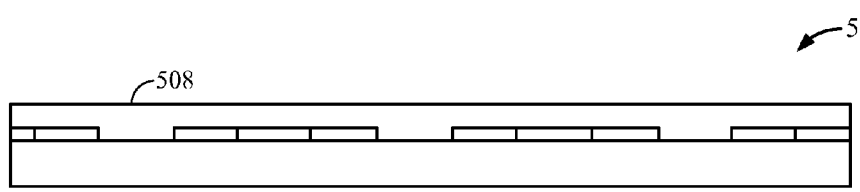

Referring to FIG. 5B, operations according to one process may include depositing a passivation layer 508 over the FIG. 5A starting structure 500-A to form the in-process structure 500-B. The passivation layer 508 may be, for example, $SiO_2$. However, $SiO_2$ is only one example material for the passivation layer 508. Persons of ordinary skill in the art, having view of the present disclosure, may identify various alternatives. The passivation layer 508 may be deposited according to conventional passivation layer techniques, not necessarily particular to the exemplary embodiments. Therefore, further detailed description of the technique for depositing the passivation layer 508 is omitted. The thickness (shown, but not separately labeled) of the passivation layer 508 may be, at least in part, application-specific. Persons of ordinary skill in the art, though, facing a specific application and having read the present disclosure in its entirety, can readily determine the appropriate thickness or range of thicknesses for the passivation layer 508, without undue experimentation.

Figure 5C:
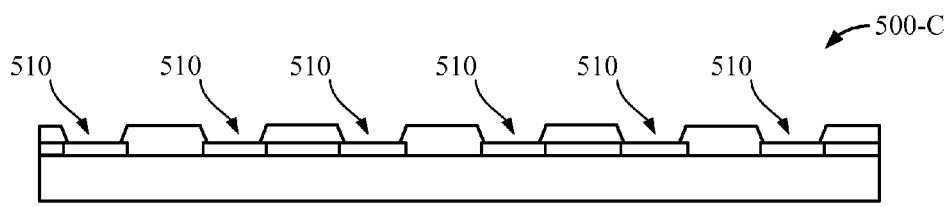

Referring to FIG. 5C, after depositing the passivation layer 508, an etching or other known removal operation may be performed to expose top surface areas 510 of the base pads 504, as shown by in-process structure 500-C. The exposed top surface areas 510, in an aspect, are sites for subsequent depositing of Cu pillars (not shown in FIG. 5C), for example, corresponding to the metal pillars 302 of the FIG. 3A-3B pillar inductor structure 300. The exposed top surface areas 510 may therefore dimensioned according to the diameter of the Cu pillars.

Figure 5D:
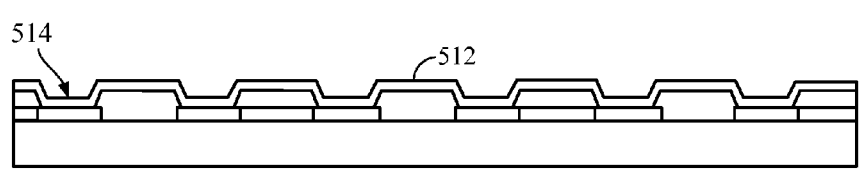

Referring to FIG. 5D, after the top surface areas 510 of the base pads 504 are exposed, in-process structure 500-D may be formed by depositing a seed layer 512 on a top surface (shown but not separately labeled) of the passivation layer 508. As shown, the seed layer 512 may cover, in particular, the exposed top surface areas 510. A function of the seed layer 512 is to assist in Cu (or alternative metal) electroplating of pillars on the exposed surface areas, as will be described in reference to later figures in this FIG. 5A-5H snapshot sequence. The seed layer 512 may comprise, for example, Cu, titanium (Ti), tantalum (Ta) or one or more alternatives that may become apparent to persons of ordinary skill upon reading this disclosure. The seed layer 512 may be deposited by, for example, conventional techniques including, but not limited to, chemical vapor deposition (CVD), plasma vapor deposition (PVD), or alternative techniques that may become apparent to such persons upon reading this disclosure. The thickness (shown, but not separately labeled) of the seed layer 512 may be, at least in part application-specific. Persons of ordinary skill, though, can determine an application appropriate thickness of the seed layer 512 without undue experimentation by applying conventional techniques in view of the present disclosure. Further detailed description of the thickness is therefore omitted. The areas of the seed layer 512 directly on the exposed top surface areas 510, of which one representative example is labeled "514" will support pillars that deposited in subsequent operations.

Figure 5E:
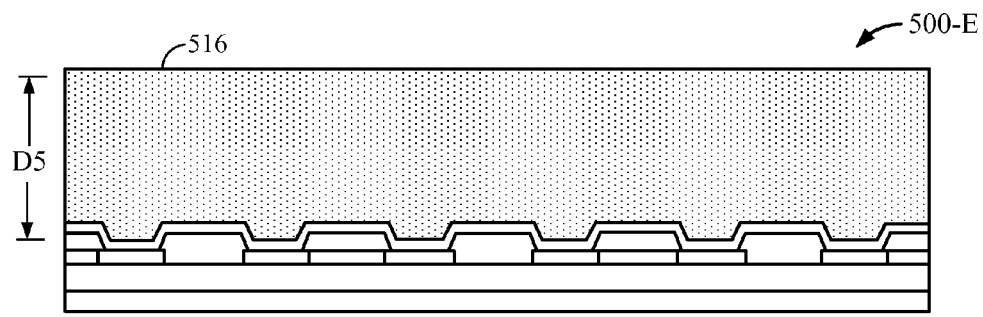

Referring next to FIG. 5E, a mold layer 516 of thickness D5 may then be deposited over the seed layer 512, forming in-process structure 500-E. The mold layer 516 may comprise, but is not limited to $SiO_2$. Alternatives to $SiO_2$ may become apparent to persons of ordinary skill upon reading this disclosure. The thickness D5 of the mold layer 516, in an aspect, can be substantially the same as a desired length (height) of the metal pillars (e.g., the metal pillars 302 of FIGS. 3A-3B. In a further aspect, the mold layer 516 may be formed with a thickness D5 greater than the desired metal pillar height to provide, for example, for depositing an inter-metallic compound (IMC) (not shown in FIG. 5E) as, described later in greater detail.

Figure 5F:
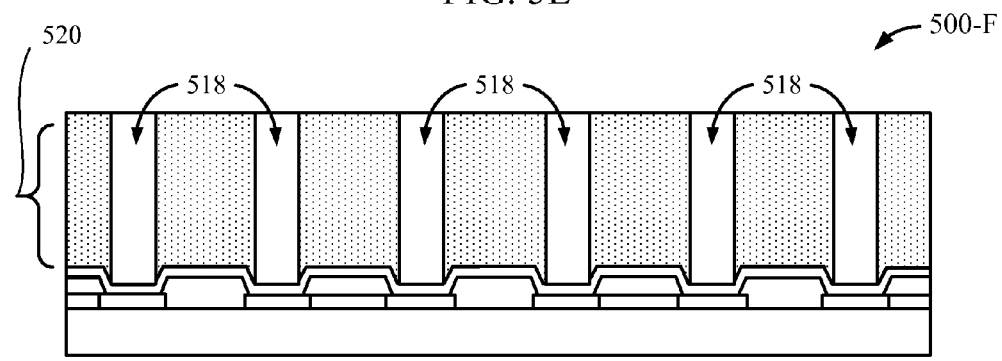

Referring to FIG. 5F, a masking and etching of pillar recesses 518 into the mold layer 516 may form in-process structure 500F having a pillar mold 520, with its pillar recesses 518 aligned with areas of the seed layer 512 on the previously exposed top surface areas 510. The pillar recesses 518 may be shaped and dimensioned according to the desired pillars, e.g., metal pillars 302 of FIGS. 3A-3B. Regarding techniques etching the pillar recesses 518, a person of ordinary skill in the art having possession of this disclosure can select and adapt a conventional etching technique to perform this etching, without undue experimentation. Further detailed description is therefore omitted.

Figure 5G:
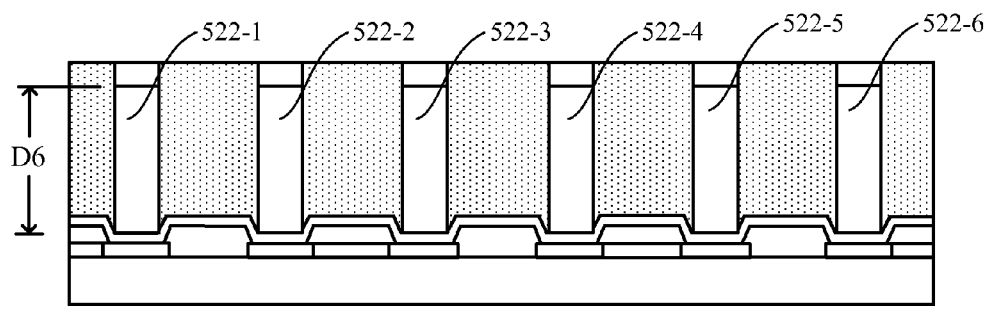

Referring to FIG. 5G, after forming the pillar mold 520, a metal, for example copper (Cu), or another conductor may be deposited to a height D6 in the pillar recesses 518. For purposes of example, it will be assumed that the deposited conductor is Cu. A result of the depositing is therefore a plurality of encased Cu pillars 522, as shown by the in-process structure 500-G. The depositing of the Cu (and various alternative metals) can be done, for example, by application of conventional electroplating techniques. The height D6 to which the Cu is deposited can be D5, i.e., it can completely fill (not shown) the pillar recesses 518. In one alternative aspect, the Cu may be deposited to a shallower depth (as shown), to allow, for example, a follow-on depositing of the previously mentioned IMC.

Figure 5H:
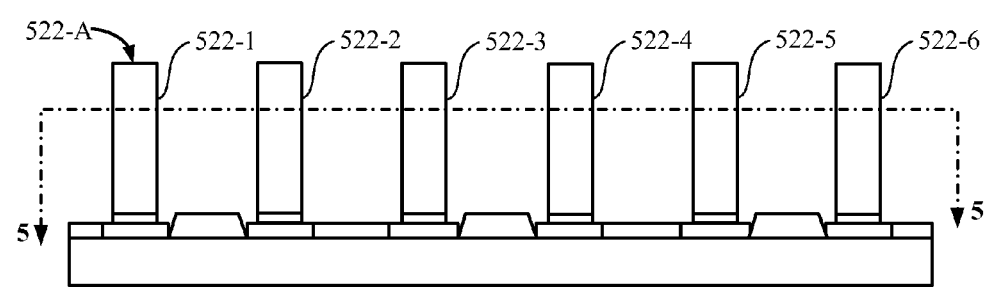

Referring next to FIG. 5H, the pillar mold 520 may be removed to provide the in-process structure 500-H. The in-process structure 500-H may comprise the lower substrate 502 supporting, on base pads 504, six Cu pillars, 522-1, 522-2 . . . 522-6 (collectively, the "Cu pillars 520," a label not explicit in the figures). In describing example aspects, Cu pillars 520 may be referred to, individually, as first Cu pillar 520-1, second Cu pillar 520-2, third Cu pillar 520-3, fourth Cu pillar 520-4, fifth Cu pillar 520-5 and sixth Cu pillar 520-6.

For convenient reference to FIG. 5H in subsequent sections of this disclosure, the tops, i.e., distal ends of the Cu pillars 522 will be generically referred to as "pillar tops 522A", of which one representative example is labeled on the first Cu pillar 522-1.

The above-described fabrication process connects the base pads 504 according to the base pad connection pattern of the 3D pillar meander inductor 350 of FIGS. 3A-3B. This example in-process structure 500-H will be referred to as a 3D pillar meander inductor "lower sub-assembly" 500-H.

Figure 6:
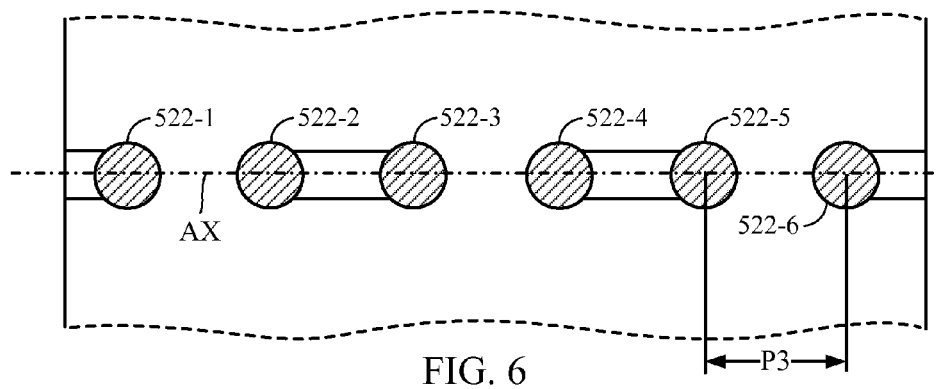
FIG. 6 is a plane view, from the FIG. 5H projection 5-5, showing an alignment of the Cu pillars extending up from the lower substrate of the 3D pillar meander inductor lower sub-assembly.

FIG. 6 is top view, from the FIG. 5H projection 5-5, showing the Cu pillars 522 spaced by pitch P3 and aligned along the axis AX.

Figure 7A:
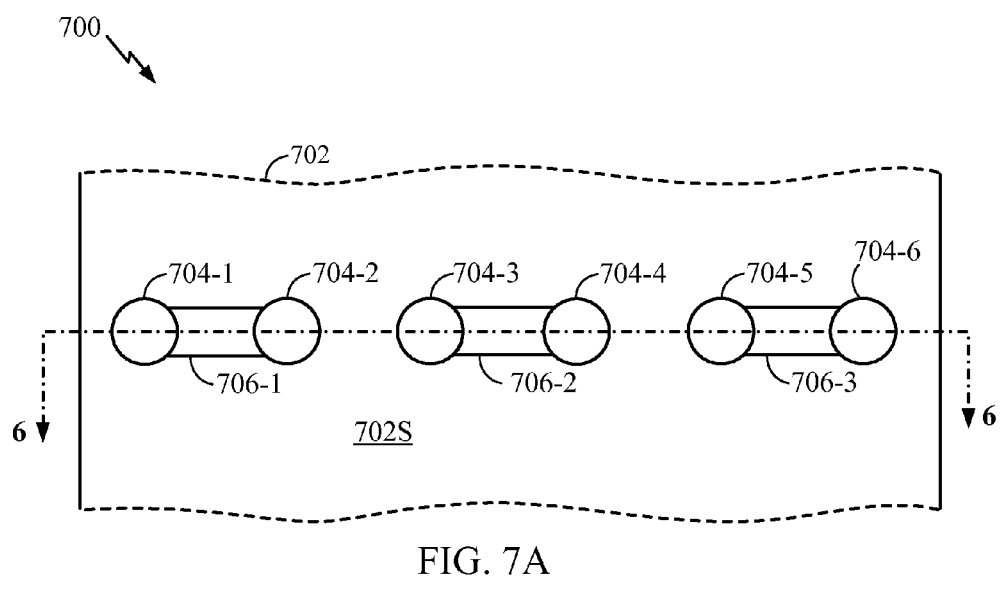
FIG. 7A is a plan view of one example arrangement of pillar top pads and pillar top interconnectors of one 3D pillar meander inductor top sub-assembly, before being flipped over for assembly with the FIG. 5H 3D pillar meander inductor lower sub-assembly.
Figure 7B:
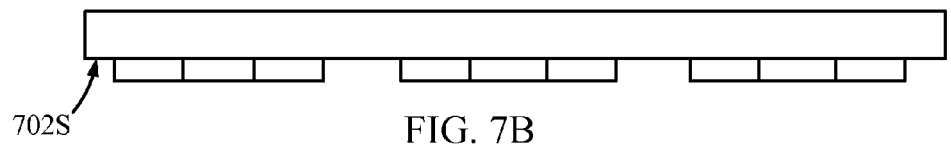
FIG. 7B is a front view from the FIG. 7A projection 6-6, after being flipped over for assembly with the FIG. 5H 3D pillar meander inductor lower sub-assembly.

FIG. 7A is a plan view of one example 3D pillar meander inductor top sub-assembly 700 configured for assembly with the 3D pillar meander inductor lower sub-assembly 500-H, to form a 3D meander inductor according to one or more exemplary embodiments. The 3D pillar meander inductor top sub-assembly 700 may include a top support structure 702 having a supporting surface 702S. FIG. 7B, is a front view from the FIG. 7A projection 6-6. Referring to FIG. 7B, and to the assembly snapshot of FIG. 7A, after being flipped over for assembly with the FIG. 5H 3D pillar meander inductor lower sub-assembly 500-H, the supporting surface 702S faces the lower substrate 502 supporting surface 502S.

Referring to FIG. 7A, the supporting surface 702S may support pillar top pads such as the first top pad 704-1, second top pad 704-2, third top pad 704-3, fourth top pad 704-4, fifth top pad 704-5 and sixth top pad 704-6 (collectively "pillar top pads 704," a label not specifically shown in the figures). The pillar top pads 704 are positioned in alignment with the Cu pillars 522 of the FIG. 5H 3D pillar meander inductor lower sub-assembly 500-H. For purposes of example, the 3D pillar meander inductor top sub-assembly 700 is shown configured with the top pad interconnection pattern shown in the 3D meander inductor 150 of FIGS. 3A-3B. Accordingly, a pillar top pad first interconnector 706-1 on the supporting surface 702S connects first top pad 704-1 to second top pad 704-2, a pillar top pad second interconnector 706-2 connects third top pad 704-3 to fourth top pad 704-4, and a pillar top pad third interconnector 706-3 connects fifth top pad 704-5 to sixth top pad 704-6. For brevity, the pillar top pad first interconnector 706-1, pillar top pad second interconnector 706-2 and pillar top pad third interconnector 706-3 will be collectively referenced as "pillar top pad interconnectors 706."

Figure 8A:
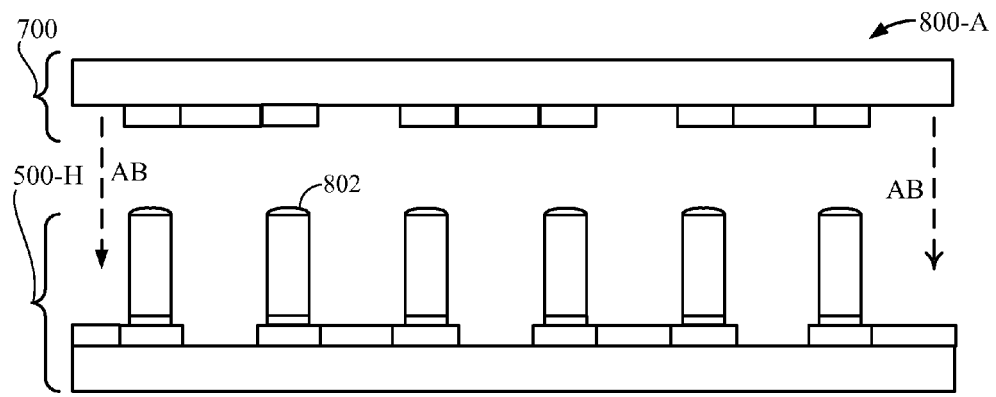
FIGS. 8A-8B show a snapshot sequence of assembly of the FIG. 7A-7B 3D pillar meander inductor top sub-assembly onto the FIG. 5H 3D pillar meander inductor lower sub-assembly to form a 3D meander inductor according to one or more exemplary embodiments.

FIG. 8A is a snapshot diagram of operation 800A of assembling the 3D pillar meander inductor top sub-assembly 700 of FIGS. 7A-7B onto the 3D pillar meander inductor lower sub-assembly 500-H of FIG. 5H. The operation 800A forms the 3D Cu pillar meander inductor structure 800B shown in FIG. 8B.

Referring to FIG. 8A, an IMC material 802 may be disposed at the pillar tops 522A, as described in reference to FIG. 5G. The IMC material 802 may be, for example, solder. However, solder generally has a lower conductivity than Cu. Therefore, in one aspect, direct Cu-to-Cu bonding (not explicitly visible in the figures) of the Cu pillar tops 522A to the pillar top pads 704, may be performed. In an aspect, direct Cu-to-Cu bonding may be preferred to increase the conductivity at the top-substrate-to-bottom-substrate-interface and, in turn, increase the Q of the 3D pillar meander inductor that results.

As shown in FIG. 8A, one or both of the 3D pillar meander inductor top sub-assembly 700 and 3D pillar meander inductor lower sub-assembly 500-H may be urged together in the "AB" direction. In an aspect, the urging may be configured to maintain an acceptable alignment of the pillar top pads 704 with the Cu pillar tops 522A. Regarding "acceptable alignment," it will be appreciated by persons of ordinary skill that a tolerance or window of acceptability with respect to the alignment may be application specific. Such persons, though, having view of the present disclosure, can readily determine the tolerance, or window of acceptability by applying basic engineering skills that such persons possess to the described concepts, without undue experimentation. The pillar top pads 704 may then be bonded the Cu pillar tops 522A in an electrically conductive manner, to obtain the Cu pillar meander inductor structure 800B shown in FIG. 8B.

Described examples show the 3D pillar meander inductor lower sub-assembly 500-H having the entirety of the Cu pillars 522, and the 3D pillar meander inductor top sub-assembly 700 having only pillar top pads 704 and the pillar top pad interconnectors 706. In other words, as thus far described, the Cu pillars 522 are formed to their desired height entirely on the areas 514 of the seed layer 512.

In one alternative embodiment, instead of the Cu pillars 522 being the full height of the completed device's Cu pillars, they may be formed only as a lower section, e.g., one-half, or one-third, of the full height. The upper or top sections of the completed devices' Cu pillars may be formed on the pillar top pads 704 of the 3D pillar meander inductor top sub-assembly 700. When the 3D pillar meander inductor upper and lower sub-assemblies are aligned, the lower sections of the Cu pillars extend up, and the upper sections of the Cu pillars extend down. On assembly, their distal ends meet and are connected. This can provide 3D pillar meander inductors according to various exemplary embodiments having Cu pillars of a greater height, or at a lower fabrication cost, or both, than can be obtained when formed entirely on, for example, a supporting surface of a lower substrate.

Figure 9A:
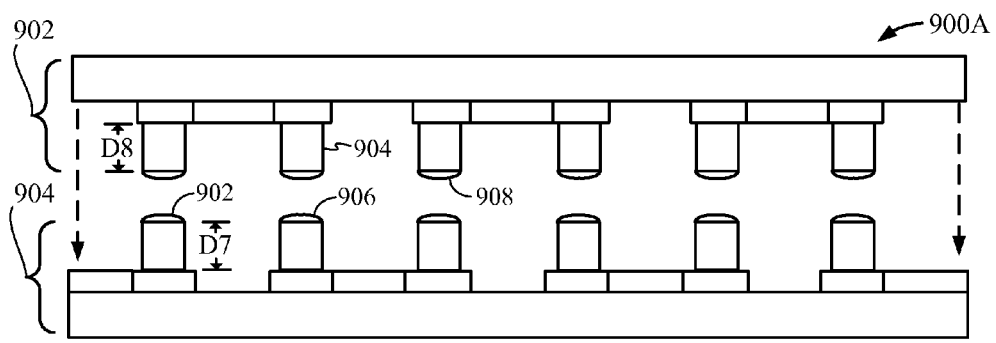
FIGS. 9A-9B show a snapshot sequence of example operations in assembling a modified 3D pillar meander inductor top sub-assembly, having a top portion of the Cu pillars, onto a modified 3D pillar meander inductor lower sub-assembly having a lower portion of the Cu pillars, to form a 3D meander inductor according to one or more exemplary embodiments.

FIG. 9A shows a projection, from the same view as FIG. 8A, of one example assembly operation 900A in assembling a modified 3D pillar meander inductor top sub-assembly 902 onto a modified 3D pillar meander inductor lower sub-assembly 904. The assembly forms the FIG. 9B 3D pillar meander inductor 900B. To avoid possible obfuscation from description of new structures, the modified 3D pillar meander inductor lower sub-assembly 904 will be assumed identical to the 3D pillar meander inductor lower sub-assembly 500-H in all respects other than its Cu pillars 906, being formed to a height D7 less than a desired end height. In other words, the Cu pillars 906 have the same base pad interconnection pattern as the Cu pillars 522. The modified 3D pillar meander inductor top sub-assembly 902 will be assumed identical in all respects to the FIG. 7A-7B 3D pillar meander inductor top sub-assembly 700 except that downward pointing (relative to the FIG. 9A drawing sheet) Cu pillars 908 are formed on the pillar top pads 704, extending downward by a height D8. A seed layer (not shown in FIG. 9A) may also be formed on the pillar top pads 704. In an aspect, D7 and D8 can be equal or unequal.

Figure 9B:
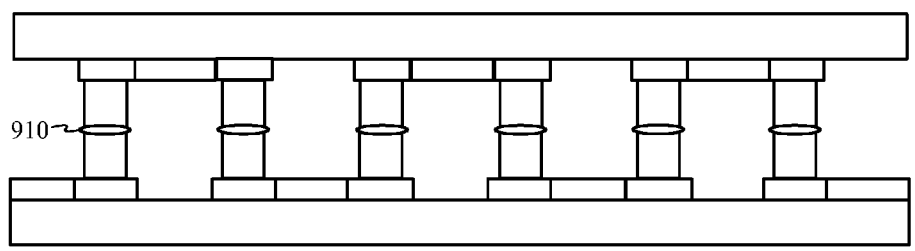

FIG. 9B shows a 3D pillar meander inductor 900B in accordance with various exemplary embodiments, resulting from the FIG. 9A assembly. The bond regions between the respective distal ends of the Cu pillars 906 and Cu pillars 908 are labeled one flow 1000 in one process of fabricating a 3D pillar inductor according to various exemplary embodiments.

Figure 10:
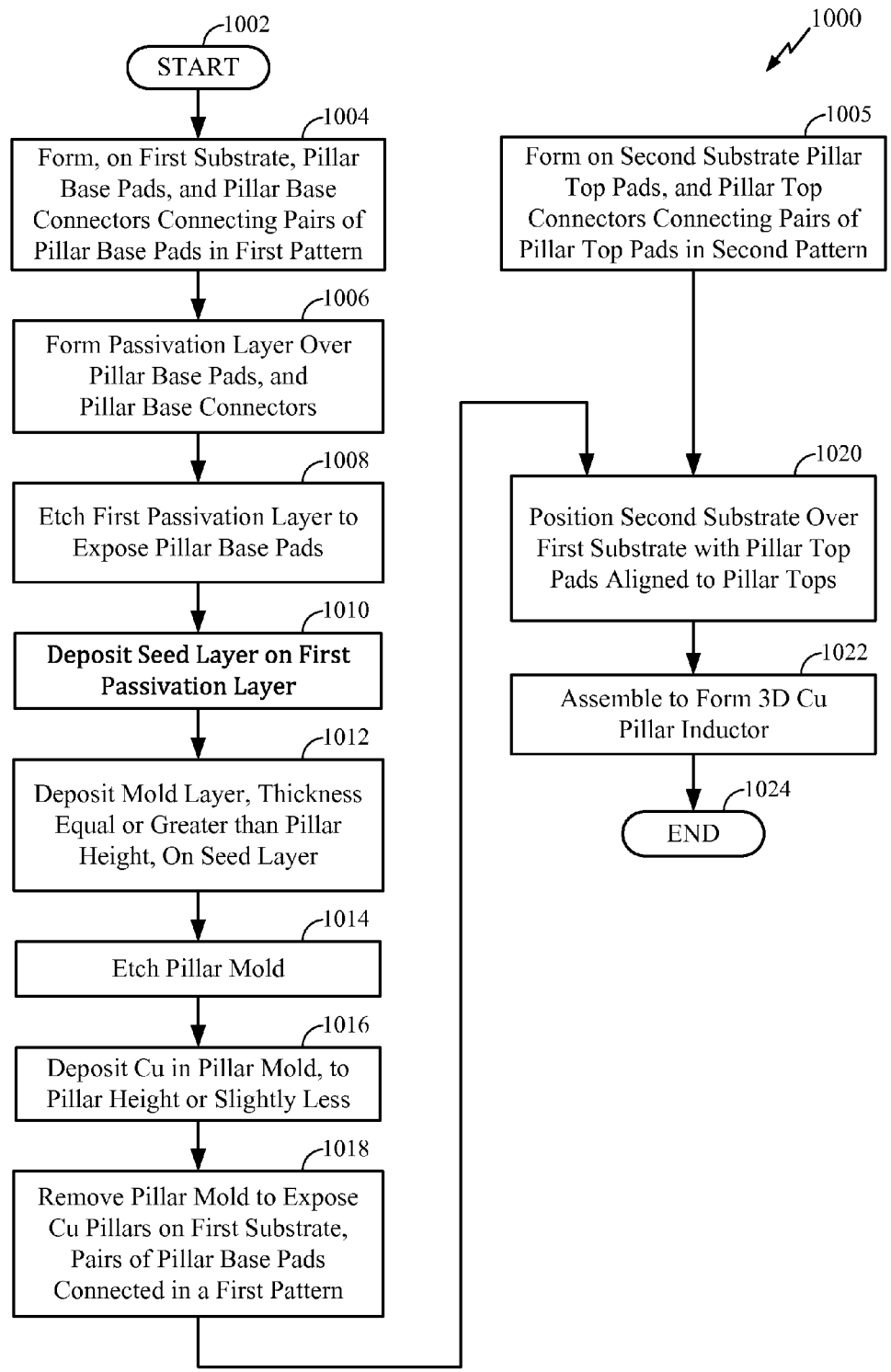
FIG. 10 shows a logic diagram of one flow of example operations in one process of fabricating a 3D pillar meander inductor according to one or more exemplary embodiments.

Referring to FIG. 10, example operations can start at 1002 and proceed to 1004 to form, on a lower substrate such as the FIG. 5A lower substrate 502, a quantity of base pads (e.g., the FIG. 5A base pads 504). The forming at 1004 may include forming base pad interconnectors (e.g., the FIG. 5A base pad interconnectors 506). In an aspect, the forming at 1004 can configure the pillar base interconnectors according to the previously described base pad interconnection pattern. Next, at 1006, the flow 1000 can form a passivation layer over the in-process structure formed at 1004. The forming at 1006 may be, for example, according to the forming of the passivation layer 508 described in reference to FIG. 5B. Next, in operations according to the flow 1000, after forming the passivation layer at 1006, operations can include, at 1008, etching or otherwise removing portions of the passivation layer to expose the tops of the base pads. The etching or removing at 1008 can be, for example, according to the etching to expose the top surface areas 510, previously described in reference to FIG. 5C.

Continuing to refer to FIG. 10, after etching or otherwise removing portions of the passivation layer at 1008 to expose the tops of the base pads, operations can include a depositing at 1010 of a seed layer on layer, primarily to cover the exposed top portions of the base pads. The depositing at 1010 can be, for example, as the depositing of the seed layer 512 previously described in reference to FIG. 5D. Next, after depositing the seed layer at 1010, operations according to the flow 1000 can, at 1012, deposit the mold layer. As previously described in reference to FIG. 5D, the mold layer can be, for example, $SiO_2$, and can be at a thickness at least the desired length of the pillars (e.g., the FIG. 3A-3B Cu pillars 302). Next, after depositing the mold layer at 1012, operations according to the flow 1000 may, at 1014, etch or otherwise remove portions of the mold layer to form recesses corresponding to the pillars. One example of this operation is the forming of the pillar recesses 518 previously described in reference to FIG. 5F.

Referring to FIG. 10, after 1014, operations according to the flow 1000 may go to 1016 and deposit Cu, or various alternative metals in the recesses etched at 1014. In an aspect, the depositing at 1016 may be to a depth equal the desired length of the pillars. In another aspect, the depositing at 1016 may be to a depth less than the desired length, to accommodate depositing the IMP on the pillar tips before removing the mold, as previously described in reference to FIG. 5G. Continuing to refer to FIG. 10, after depositing the Cu or other metal at 1016 to the desired depth, operations according to the flow 1000 can remove the mold at 1018 to expose the pillars. The resulting structure can be, for example, the base supported pillar and connect structure 500G previously described in reference to FIG. 5H.

Figure 8B:
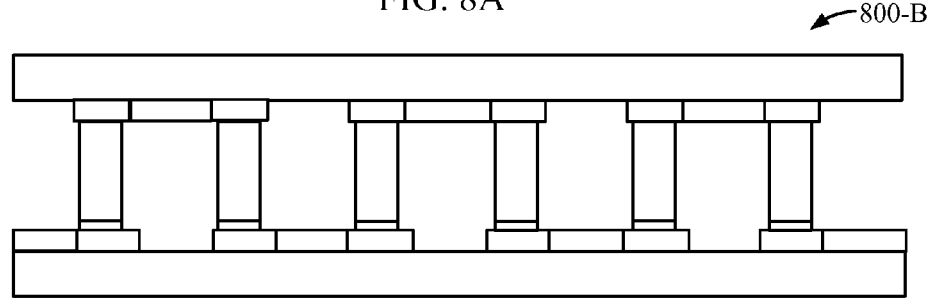

With continuing reference to FIG. 10, operations according to the flow 1000 can include, at 1005, providing, or fabricating, a pillar top connection structure, having a substrate supporting pillar top pads (e.g., the FIG. 3A-3B pillar top pads 310) and pillar top pad interconnectors (e.g., the FIG. 3A-3B top pad interconnectors 314). The operations at 1005 can form, for example, the 3D pillar meander inductor top sub-assembly 700 described in reference to FIG. 7A. Next, operations at 1020 can position the pillar top connection structure over the base supported pillar and pillar connect structure produced at 1018 and then at 1022, as shown at FIGS. 8A-8B, assemble these to form a 3D pillar inductor in accordance with one or more exemplary embodiments. The flow 1000 can then end at 1024.

Figure 11A:
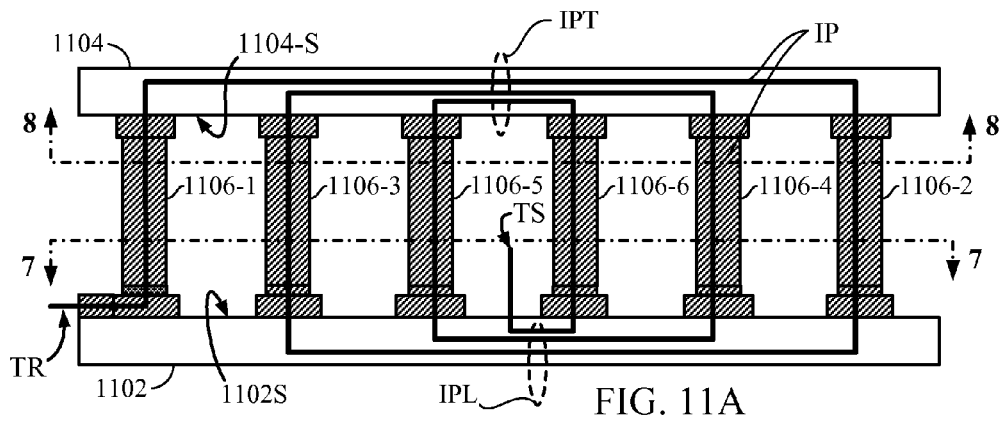
FIG. 11A is a front view of a 3D pillar rectangular spiral inductor according to one or more exemplary embodiments, viewed from a projection normal to the plane of the lower substrate.

One exemplary alternative embodiment may include a 3D pillar spiral inductor. FIG. 11A is a front projection of one example 3D pillar spiral inductor 1100 in accordance with various exemplary embodiments. The 3D pillar spiral inductor 1100 can include a lower substrate 1102 having a support surface 1102S, and an upper or top support surface 1104S of an upper or top support structure 1104, spaced above and parallel to the lower substrate 1102. The 3D pillar spiral inductor 1100 may include plurality of (e.g., six) metal (e.g., Cu) pillars, for example, the Cu pillars 1106-1, 1106-2 . . . 1106-6 (referenced collectively as "Cu pillars 1106." It will be understood that the labeling of the Cu pillars 1106-1, 1106-2 . . . 1106-6 is not in a left-to-right order. In describing example aspects, Cu pillars 1106 may be referred to, individually, as first Cu pillar 1106-1, second Cu pillar 1106-2, third Cu pillar 1106-3, fourth Cu pillar 1106-4, fifth Cu pillar 1106-5 and sixth Cu pillar 1106-6.

Each of the Cu pillars 1106 extends from a respective base pillar pad (shown, but not separately labeled) on the support surface 1102S of the lower substrate 1102 to a respective top pillar pad (shown, but not separately labeled) on the surface 1104S of the top support structure 1104. In an aspect, the Cu pillars 1106 may be formed only on the base pillar pads, for an assembly comparable to FIGS. 8A-8B. In another aspect, the Cu pillars 1106 may be formed on both the base pillar pads and the top pillar pads, for an assembly comparable to FIGS. 9A-9B.

For convenience in describing example features, connections to a base pillar pad of a Cu pillar 1106 will be referred to as "a connection to" or "connects to" the "base of Cu pillar 1106." For like purposes, connections to a top pillar pad of a Cu pillar 1106 will be referred to as "a connection to" or something that "connects to" the "top of Cu pillar 1106."

Figure 11B:
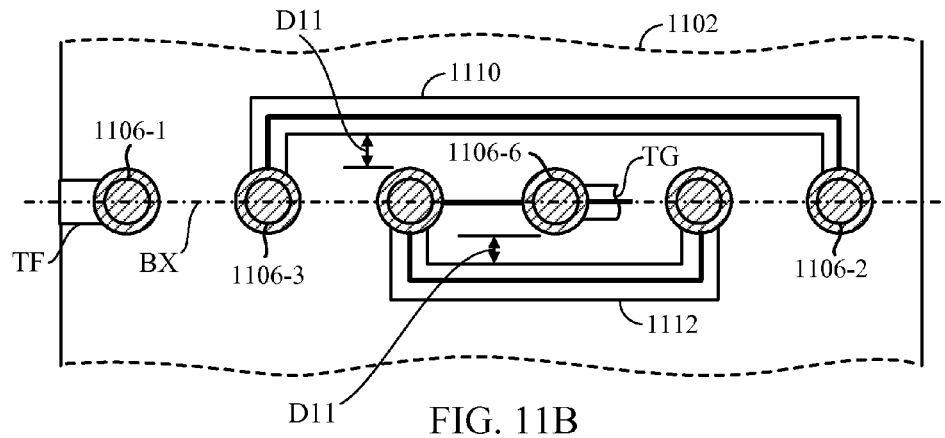
FIG. 11B is a projection, on the FIG. 11A cutting plane 7-7 showing one example arrangement of Cu pillars and base pad interconnection for one example 3D pillar rectangular spiral inductor in accordance with various exemplary embodiments.

FIG. 11B is a cross-sectional projection from the projection 7-7 facing the support surface 1102S of the lower substrate 1102. Referring to FIG. 11B, the Cu pillars 1106 may be aligned along a linear axis BX, and evenly spaced by a pitch (shown but not separately labeled). The support surface 1102S may also support a first terminal "TF" connected to the base of the first Cu pillar 1106-1, and a second terminal "TG" connected to the base of the sixth Cu pillar 1106-6. An inductor first base segment 1110, for example, on the support surface 1102S, connects the base of the third Cu pillar 1106-3 to the base of fifth Cu pillar 1106-5. The inductor first base segment 1110 may have a major portion (shown but not separately labeled) that may extend parallel BX. The major portion of the inductor first base segment 1110 may be spaced a distance D11, in a first direction perpendicular to BX, from an upper (relative to the plane of FIG. 11B) outer edge of the respective base pads (shown but not separately numbered) of the fourth Cu pillar 1106-4, fifth Cu pillar 1106-5 and sixth Cu pillar 1106-6. An inductor second base segment 1112 connects the base of the fourth Cu pillar 1106-4 to the base of the fifth Cu pillar 1106-5. The inductor second base segment 1112 may likewise have a major portion (shown but not separately labeled) that may also extend parallel BX, but spaced the distance D11 in a second direction opposite the first direction, from a lower outer edge of the base pad of sixth Cu pillar 1106-6.

Figure 11C:
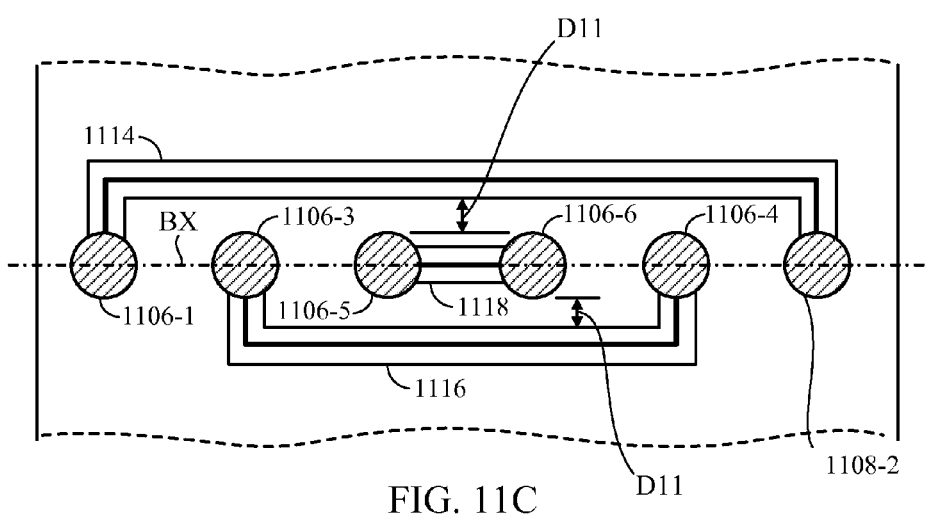
FIG. 11C is a projection, on the FIG. 11A cutting plane 8-8, showing one example arrangement of Cu pillar top pads and respective pillar top pad interconnectors, one example 3D pillar rectangular spiral inductor in accordance with various exemplary embodiments.

FIG. 11C is a cross-sectional projection from the FIG. 11A cut plane 8-8 facing the support surface 1104S of the top support structure 1104. Referring to FIG. 11C, the support surface 1104S supports an inductor first top segment 1114, an inductor second top segment 1116, and an inductor third top segment 1118. The inductor first top segment 1114 connects the top of Cu pillar 1106-1 to the top of Cu pillar 1106-2. The inductor first top segment 1114 has a major portion (shown but not separately labeled) extending parallel BX. The major portion of the inductor first top segment 1114 is spaced the above-described distance D11, in the first direction, from an upper (relative to the plane of FIG. 11B) outer edge of the pillar top pads (shown, but not separately labeled) of the fourth Cu pillar 1106-4, sixth Cu pillar 1106-6 and third Cu pillar 1106-3. The inductor second top segment 1116 connects the top of the fourth Cu pillar 1106-4 to the top of the third Cu pillar 1106-3. The inductor second top segment 1116 has a major portion (shown but not separately labeled) extending parallel BX, and spaced the distance D11 in the second direction from an outer edge of the base pad of the sixth Cu pillar 1106-6. The inductor third top segment 1118 connects the top of the fifth Cu pillar 1106-5 to the top of the sixth Cu pillar 1106-6. The inductor third top segment 1118 can extend aligned with BX.

Referring to FIG. 11A, the above-described structure forms a spiral inductor current path IP having what can be characterized as three rectangular loops. It will be understood that the segments "IPT" and "IPL" of the spiral inductor current IP are drawn with vertically spaced segment lines, but these lines represent multiple, co-planar current segments. For example, an innermost or first loop (shown but not separately labeled) established by the fifth Cu pillar 1106-5 and sixth Cu pillar 1106-6, together with the inductor third top segment 1118. A next outer or second loop (shown but not separately labeled), in series with the first loop, is established by the third Cu pillar 1106-3 and fourth Cu pillar 1106-4, inductor second base segment 1112 and inductor second top segment 1116. A third or outermost loop is fed by the second loop, and is established by the first Cu pillar 1006-1 and second Cu pillar 1006-2, inductor first upper segment 1014 and inductor first base segment 1010.

In an aspect, a sub-section of the FIG. 11A to 11C structure may implement a spiral inductor with a reduced quantity (e.g., less than three) loops. For example, the base pad of the second Cu pillar 1106-2 may be assigned as a first terminal, and the base pad of fourth Cu pillar 1106-4 may be assigned as the second terminal. The first Cu pillar 1106-1 and the sixth Cu pillar 1106-6 may be omitted.

Various alternative embodiments of a 3D inductor may employ, in place of the FIG. 3A-3B metal (e.g., Cu) pillars 302, solder ball inductor segments configured and arranged to function, for example, as the arms of a 3D meander inductor.

Figure 12:
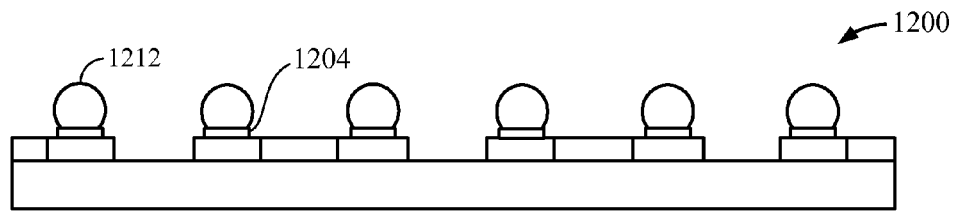
FIG. 12 is a front view of one 3D solder ball meander inductor lower sub-assembly according to one exemplary alternative embodiment.

FIG. 12 shows one alternative 3D meander inductor lower sub-assembly 1200 having, in place of the metal (e.g., Cu) pillars 302 of the FIG. 3A-3B pillar meander inductor 350, solder ball inductor segments. In the FIG. 12 example, the solder ball inductor segments include a first solder ball 1202-1, a second solder ball 1202-2, a third solder ball 1202-3, a fourth solder ball 1204-4, a fifth solder ball 1202-5 and a sixth solder ball 1202-6 (collectively "solder ball inductor segments 1202," a label not appearing on the figures). To avoid unnecessary added description it will be assumed that, except where specifically stated, or where made clear from the context to be otherwise, the alternative 3D meander inductor lower sub-assembly 1200 is structured identical to the FIG. 5H example 3D Cu pillar meander inductor lower sub-assembly 500-H. To reduce duplicative labeling, like structures are not numbered. The solder ball inductor segments 1202 may each be formed on a wetting surface, of which one representative example is numbered 1204.

Figure 13A:
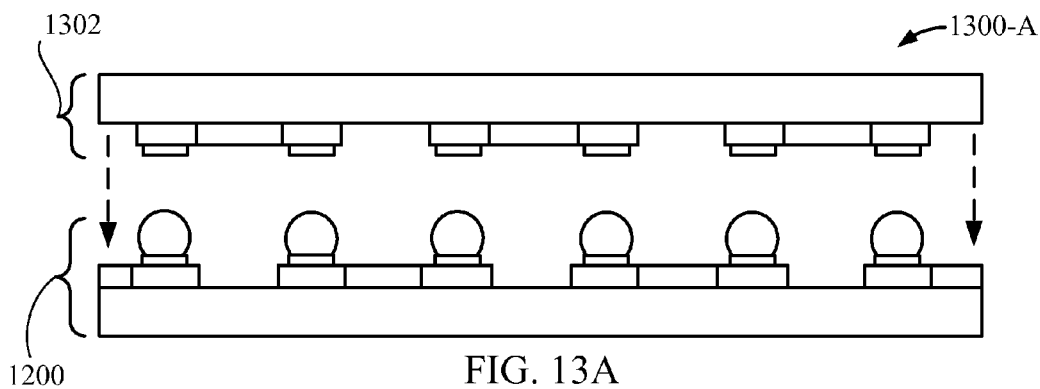
FIGS. 13A-13B show a snapshot second of one example operation in assembling a 3D solder ball meander inductor top sub-assembly onto a modified 3D solder ball meander inductor lower sub-assembly, to form a 3D solder ball meander inductor according to one exemplary alternative embodiments.
Figure 13B:
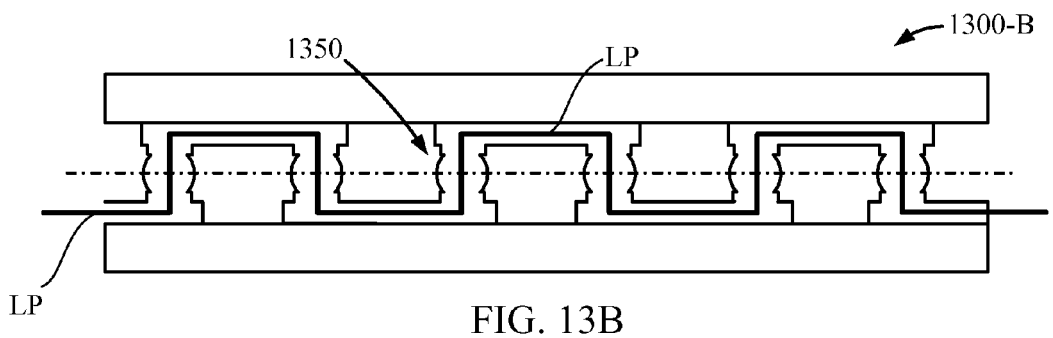

FIGS. 13A-13B show a snapshot sequence of example operations in an assembly process assembling a 3D meander inductor top sub-assembly 1302 onto the FIG. 12 3D meander inductor lower sub-assembly 1200. To avoid unnecessary added description it will be assumed that, except where specifically stated, or made clear from the context to be otherwise, the 3D meander inductor top sub-assembly 1302 is identical to the FIG. 7A-7B example 3D pillar meander inductor top sub-assembly 700, and like structure is not numbered. In an aspect, the 3D meander inductor top sub-assembly 1302 may include wetting surfaces (not explicitly shown in FIGS. 13A-13B) disposed on the FIG. 7A pillar top pads 704.

Referring to FIG. 13B the result of the assembly shown by the FIG. 13A snapshot provides a 3D meander inductor 1350, providing a meander current path LP. As shown, the meander current path LP is within a plane that is normal to the plane (shown, but not separately labeled) that supports the solder ball inductor segments 1202.

Exemplary embodiments and aspects have been described hereinabove in reference to examples having Cu pillars arranged along a linear axis, e.g., the FIG. 4A axis AX. 3D inductors according to one or more further embodiments may include 3D Cu pillar inductors having two-dimensional, or X-Y arrangements of conducting, e.g., Cu pillars. In an aspect, one example 3D Cu pillar inductor having two-dimensional, e.g., X-Y arrangements of Cu pillars in accordance with various exemplary embodiments may provide N-turn Cu pillar coil inductors.

In one aspect, an N-turn Cu pillar coil inductor may be provided, comprising two adjacent rows or columns of N Cu pillars, the two rows or columns extending, for example in the X direction. The spacing between the adjacent rows or columns may be in the Y direction. A winding axis may be defined as extending parallel to, and between the two adjacent rows or columns. Along either of the adjacent rows or columns, the base of each of the N Cu pillars may be linked, for example, by a pillar base cross-connector that crosses, in the Y direction, under the winding axis to the base of a corresponding opposing Cu pillar in the other row or column. In an aspect, a resulting structure may be a concatenation of N partial windings. Each of the N particle windings may be formed of a pair of opposing Cu pillars straddling the winding axis and linked, at their respective pillar tops, by a pillar base interconnector. In an aspect, the pillar base interconnector may pass under, and be bifurcated by the winding axis. In a further aspect, the concatenation of N partial windings may be formed into a concatenation of N full windings by N−1 adjacent winding links that cross diagonally over the winding axis between particular pillar tops of the adjacent rows or columns.

In an aspect, a fabrication of an N-turn Cu pillar coil inductor according to various exemplary embodiments may include fabricating an N-turn Cu pillar coil inductor lower sub-assembly having, on a lower substrate, the described rows or columns of Cu pillars, linked by pillar cross-connectors to form a concatenation of N partial windings. In a further aspect, an N-turn Cu pillar coil inductor upper or top sub-assembly may be fabricated, having N−1 adjacent winding links. The N-turn Cu pillar coil inductor top sub-assembly may be arranged such that when assembled with the N-turn Cu pillar coil inductor lower sub-assembly, the N−1 adjacent winding links cross diagonally over the winding axis, and connect Cu pillar tops in a pattern forming a concatenation of N full windings.

Figure 14A:
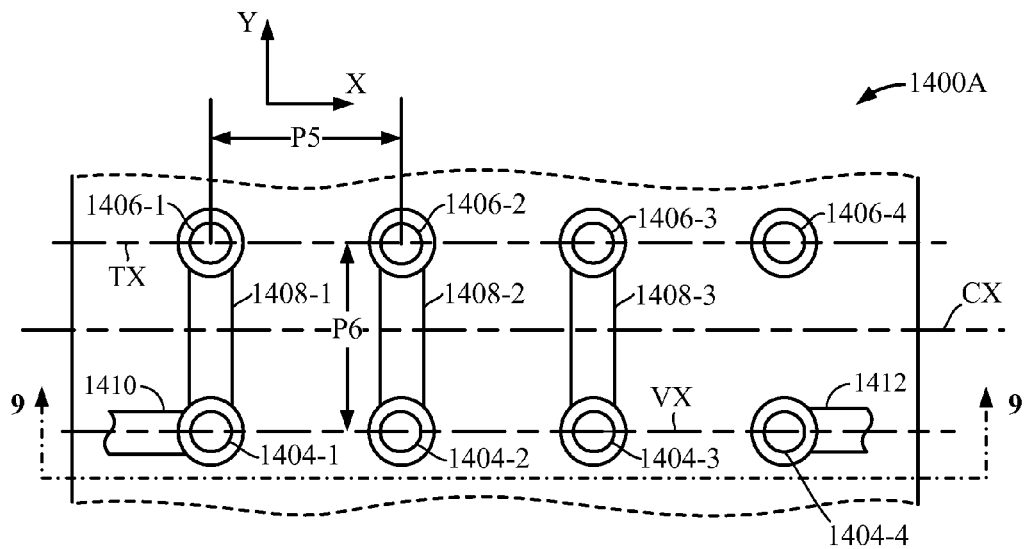
FIG. 14A is a plan view of a lower sub-assembly of a 3-turn Cu pillar coil inductor in accordance with one or more exemplary embodiments.
Figure 14B:
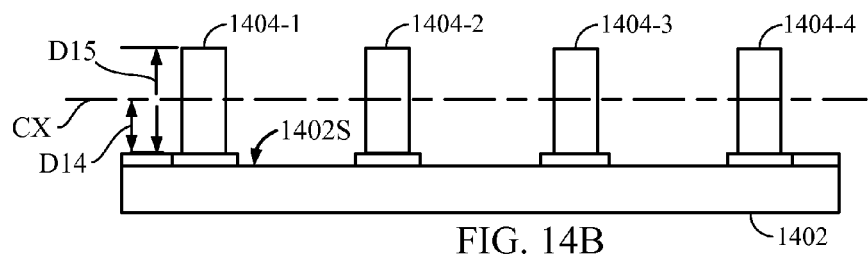
FIG. 14B is a front view, from the FIG. 14A projection 9-9.

FIG. 14A is a plan view of a lower sub-assembly 1400 of a 3-turn Cu pillar coil inductor (not shown in its entirety in FIGS. 14A-14B) in accordance with one or more exemplary embodiments, viewed from a direction normal to a support surface 1402S of, for example, a lower substrate 1402. FIG. 14B is a front view, from the FIG. 14A projection 9-9. For brevity, the phrase "lower sub-assembly 1400 of a 3-turn Cu pillar coil inductor in accordance with one or more exemplary embodiments" will be recited in the abbreviated form "pillar coil inductor lower sub-assembly" 1400. As described later in greater detail, the pillar coil inductor lower sub-assembly 1400 may be configured for subsequent assembly with a pillar coil inductor upper or top sub-assembly (not shown in FIGS. 14A-14B) to form a 3-turn Cu pillar coil inductor according to one or more exemplary embodiments.

Referring to FIG. 14A, the lower substrate 1402 may be a portion of a larger lower substrate (not necessarily entirely visible in the figures). The support surface 1402S may support the row of Cu pillars 1404-1, 1404-2, 1404-3, 1404-4 (collectively "Cu pillars" 1404) and, on the opposite side of the given winding axis "CX," the row of Cu pillars 1406-1, 1406-2, 1406-3, 1406-4 (collectively "Cu pillars" 1406). As will be appreciated by persons of ordinary skill in the art after reading this disclosure, in the example shown by FIGS. 14A-14B, Cu pillar 1406-4 may be omitted. The row of Cu pillars 1404 may be along row line "TX," and the row of Cu pillars 1406 may be along row line "VX." It will be understood that the row lines TX and VX are shown as linear only for purposes of example, as practices according to various exemplary embodiments may include a pillar coil inductor comprising a non-linear X-Y arrangement of its Cu pillars.

Referring to FIG. 14B, the Cu pillars 1404 may be equally spaced from one another by a pitch P5 along the TX row line. In an alternative embodiment, the Cu pillars 1404 may be unequally spaced. In an aspect, the Cu pillars 1406 may be arranged along row line VX in a manner identical to, or approximately the same as the arrangement of the Cu pillars 1404 along row line TX. The pitch from row line TX to row line VX is P6. It will be understood that the pitch P5 and P6 can be significantly smaller than the pitch P1 and P2 of the FIG. 1 related art TGV inductors.

Referring to FIG. 14B, the winding axis CX is shown elevated a height D14 above the support surface 1402S. In one aspect, the height D14 may be approximately one-half the height D15 of the Cu pillars 1404 and 1406. In an aspect, though, a pillar coil inductor top sub-assembly may have top sections (not visible in FIGS. 14A-14B) of Cu pillars, such that the height of the Cu columns (not necessarily shown in FIGS. 14A-14B) of the final pillar coil inductor into which the pillar coil inductor lower sub-assembly 1400 is assembled is greater than D15. In such aspects, D14 may be greater than one-half of D15.

Referring to FIGS. 14A-14B, the Cu pillars 1404 and Cu pillars 1406 are shown as disposed on respective base pads (shown but not separately numbered.) To avoid obfuscation by description of structural detail, connections to the respective pillar pad of a particular Cu pillar 1404 or 1406 will be referred to as a "connection to the base of" or "connects to the base of" the particular Cu pillar 1404 or 1406.

Referring to FIG. 14A, the support surface 1402S may support a pillar base cross-connector 1408-1 that connects at one end (shown but not separately numbered) to the base of Cu pillar 1404-1, crosses under the winding axis WX, and connects at its other end to the base of Cu pillar 1406-1. In a similar manner, pillar base cross-connector 1408-2 connects at one end to the base of Cu pillar 1404-2, crosses under the winding axis CX, and connects to the base of Cu pillar 1406-2. The combination of the Cu pillars 1404-1, 1406-1, 1404-2, and pillar base cross-connector 1408-1 may be referred to as a "first partial turn" of the 3-turn pillar coil inductor lower sub-assembly 1400.

In like manner, a base cross-connector 1408-3 connects at one end to the base of Cu pillar 1404-3, crosses under the winding axis CX, and connects to the base of Cu pillar 1406-3. The combination of the pillar base cross-connector 1408-2, and the Cu pillars 1406-2 and 1404-2 may be referred to as a "second partial turn" of the 3-turn pillar coil inductor lower sub-assembly 1400. Continuing, the pillar base cross-connector 1408-3 connects at one end to the base of Cu pillar 1404-3, crosses under the winding axis CX, and connects to the base of Cu pillar 1406-3. The combination of the pillar base cross-connector 1408-3, and Cu pillar 1406-3 and Cu pillar 1404-4 may be referred to as a "third partial turn" of the pillar coil inductor lower sub-assembly 1400. For purposes of describing example operations, a first terminal lead 1410 is shown connected to the base of pillar 1404-1, and a second terminal lead 1412 is shown connected to the base of pillar 1404-4.

Figure 15:
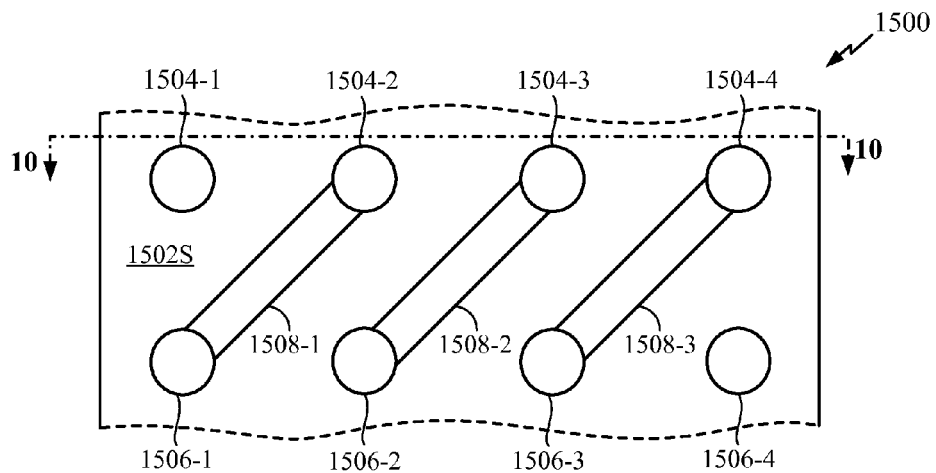
FIG. 15 is a plan view of one example Cu pillar coil inductor upper or top sub-assembly configured for assembly with the FIG. 14A-14B pillar coil inductor lower sub-assembly 1400, to form a 3-turn pillar coil inductor according to one or more exemplary embodiments.
Figure 16A:
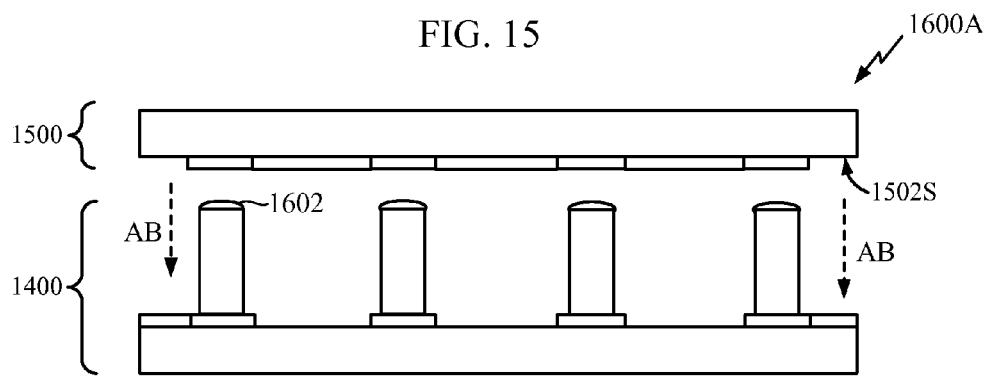
FIGS. 16A-16B shows a snapshot of one example operation in assembling the FIG. 15 pillar coil inductor top sub-assembly onto the FIG. 14A-14B pillar coil inductor lower sub-assembly to form a 3-turn pillar coil inductor according to one or more exemplary embodiments

FIG. 15 is a plan view of one example Cu pillar coil inductor upper or top sub-assembly 1500 configured for assembly with the pillar coil inductor lower sub-assembly 1400, to form a 3-turn pillar coil inductor (visible in its entirety in FIG. 15) according to one or more exemplary embodiments. FIG. 16A shows, as sub-assembly 1601-B, a front view of the Cu coil inductor top sub-assembly 1500, from the FIG. 15 projection plane 10-10, after being flipped over for assembly with the pillar coil inductor lower sub-assembly 1400.

Referring to FIG. 15, the supporting surface 1502S supports two rows of four pillar top pads, namely, the row of pillar top pads 1504-1 . . . 1504-4, and the row of pillar top pads 1506-1 . . . 1506-4. In an aspect, pillar top pad 1506-4 may be omitted. The rows of pillar top pads 1504-1 . . . 1504-4 and 1506-1 . . . 1506-4 can be positioned to align with the tops of pillars 1404-1 . . . 1404-4, and the tops of pillars 1406-1 . . . 1406-4, respectively, when Cu coil inductor top sub-assembly 1500 is aligned above the pillar coil inductor lower sub-assembly 1400.

A top first adjacent turn link 1508-1 connects at one end (shown but not separately numbered) to pillar 1506-1 and extends diagonally to pillar top pad 1504-2. A top second adjacent turn link 1508-2 connects at one end (shown but not separately numbered) to pillar 1506-2 and extends diagonally to pillar top pad 1504-3. In like manner, a top third adjacent turn link 1508-3 connects at one end (shown but not separately numbered) to pillar top pad 1506-3 and extends diagonally to pillar top pad 1504-4.

Figure 16B:
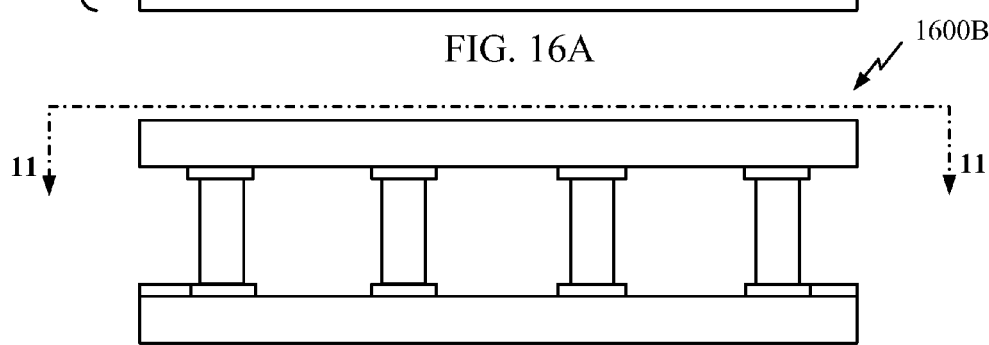
Figure 17:
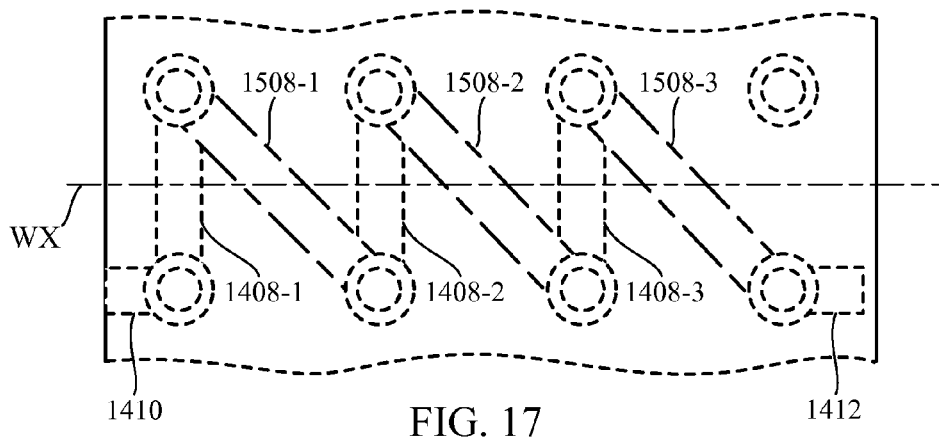
FIG. 17 is a top view of the 3-turn pillar coil inductor of FIG. 16B from projection 11-11 showing, by hidden lines, pillar cross connectors crossing under the winding axis WX and the pillar adjacent turn links passing, diagonally, over the winding axis WX.

FIG. 16A, as previously described, shows a snapshot of one example operation in assembling the above-described pillar coil inductor top sub-assembly 1500 onto the pillar coil inductor lower sub-assembly 1400 modified by an IMG 1602 formed on the tops of the Cu pillars 1404-1 . . . 1404-4, and Cu pillars 1406-1 . . . 1406-4 (not explicitly visible in FIG. 16A). One or both of the sub-assemblies 1500 and 1400 may be urged along the "AB" axis, to move together with proper alignment. Referring to FIG. 16B, a bonding of the pillar top pads 1504-1 . . . 1504-4 to the tops of pillars 1404-1 . . . 1404-4, and pillar top pads 1506-1 . . . 1506-4 to the tops of pillars 1406-1 . . . 1405-4 forms a pillar coil inductor 1600B according to one or more exemplary embodiments FIG. 17 is a top view of the 3-turn pillar coil inductor 1600B from the FIG. 16B projection 11-11, showing in hidden lines the pillar cross connectors 1408-1, 1408-2, and 1408-3 crossing under the winding axis CX and the pillar adjacent turn links 1508-1, 1508-2, and 1508-3 passing, diagonally, over the winding axis CX.

Figure 18:
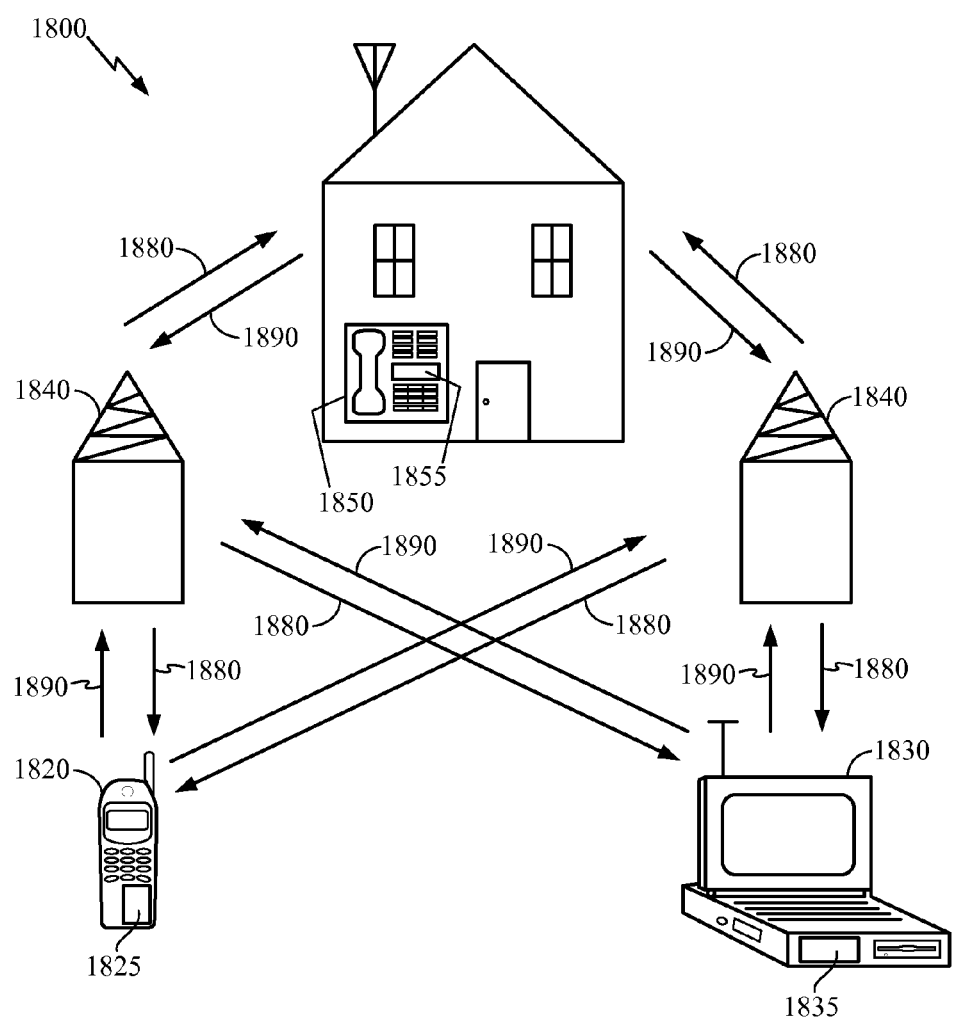
FIG. 18 shows one example functional schematic of one example personal communication and computing device in accordance with one or more exemplary embodiments.

FIG. 18 illustrates an exemplary communication system 1800 in which one or more embodiments of the disclosure, e.g., as described in reference to any one or more of FIGS. 3A-3B, 4A-4B, 5A-5H, 8A-8B, 9A-9B, 10, 11A-11C, 12, and 13A-13B, may be advantageously employed. For purposes of illustration, FIG. 18 shows three remote units 1820, 1830, and 1850 and two base stations 1840. It will be recognized that conventional wireless communication systems may have many more remote units and base stations. The remote units 1820, 1830, and 1850 include integrated circuit or other semiconductor devices 1825, 1835 and 1855 having one or more pillar inductors in accordance with one or more of the disclosed exemplary embodiments, e.g., as described in reference to any one or more of FIGS. 3A-3B, 4A-4B, 5A-5H, 8A-8B, 9A-9B, 10, 11A-11C, 12, and 13A-13B. FIG. 18 shows forward link signals 1880 from the base stations 1840 and the remote units 1820, 1830, and 1850 and reverse link signals 1890 from the remote units 1820, 1830, and 1850 to the base stations 1840.

In FIG. 18, the remote unit 1820 is shown as a mobile telephone, the remote unit 1830 is shown as a portable computer, and the remote unit 1850 is shown as a fixed location remote unit in a wireless local loop system. These are only examples, both in terms of quantity and type. For example, the remote units 1820, 1830 and 1850 may be one of, or any combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 18 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

The foregoing disclosed devices and functionalities, e.g., as described in reference to any one or more of FIGS. 3A-3B, 4A-4B, 5A-5H, 8A-8B, 9A-9B, 10, 11A-11C, 12, and 13A-13B, may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A three-dimensional (3D) inductor, comprising:
a first base pad and a second base pad, spaced by a pitch, arranged on a given base pad support surface;
a first conducting member having a base aligned with and coupled to the first base pad, and having a top at a height above the first base pad;
a second conducting member having a base aligned with and coupled to the second base pad, and a top at the height above the second base pad;
a first top pad arranged on a given top pad support surface above and facing the given base pad support surface, aligned with the first base pad and coupled to the top of the first conducting member;
a second top pad on the given top pad support surface, aligned with the second base pad and coupled to the top of the second conducting member; and
a top pad interconnector aligned with a linear axis on the given top pad support surface, the top pad interconnector coupling the first top pad to the second top pad;
wherein the height and the pitch of the first conducting member and the second conducting member are configured wherein a meander current path establishes an inductor approximating a meander inductor having two arms with an arm length corresponding to the height and an arm spacing corresponding to the pitch, having the first base pad as a first terminal and the second base pad as a second terminal.

2. The 3D inductor of claim 1, wherein the first conducting member, the first top pad, the top pad interconnector, the second top pad and the second conducting member establish the meander current path, from the first base pad to the second base pad, within a plan normal to the given base pad support surface.

3. The 3D inductor of claim 1, wherein the first conducting member is a metal first pillar and the second conducting member is a metal second pillar.

4. The 3D inductor of claim 3, wherein the metal first pillar is a first copper (Cu) pillar and the metal second pillar is a second Cu pillar.

5. The 3D inductor of claim 1, wherein the first conducting member is a first solder ball, having a base that is solder bonded to the first base pad, and a top that is solder bonded to the first top pad, and the second conducting member is a second solder ball, having a base that is solder bonded to the second base pad, and a top that is solder bonded to the second top pad.

6. A three-dimensional (3D) inductor, comprising:
a first base pad and a second base pad, spaced by a pitch, arranged on a given base pad support surface;
a first conducting member having a base aligned with and coupled to the first base pad, and having a top at a height above the first base pad;
a second conducting member having a base aligned with and coupled to the second base pad, and a top at the height above the second base pad;
a first top pad arranged on a given top pad support surface above and facing the given base pad support surface, aligned with the first base pad and coupled to the top of the first conducting member;
a second top pad on the given top pad support surface, aligned with the second base pad and coupled to the top of the second conducting member; and
a first top pad interconnector aligned with a linear axis on the given top pad support surface, the top pad interconnector coupling the first top pad to the second top pad;
a third base pad and a fourth base pad on the given base pad support surface, the first base pad, the second base pad, the third base pad and the fourth base pad aligned along a linear axis and spaced from one another by the pitch;
a base pad interconnector on the given base pad support surface coupling the first base pad and the second base pad;
a third conducting member, aligned with and coupled to the third base pad, and a fourth conducting member aligned with and coupled to the fourth base pad, the third conducting member and the fourth conducting member having the height;
a third top pad on the given top pad support surface, aligned with and coupled to a top of the third conducting member, and a fourth top pad on the given top pad support surface, aligned with and coupled to a top of the fourth conducting member; and
a second top pad interconnector on the given top pad support surface, coupling the third top pad to the fourth top pad.

7. The 3D inductor of claim 6, wherein the first conducting member, the first top pad, the first top pad interconnector, the second conducting member, the second base pad, the base pad interconnector, the third base pad, the third conducting member, the third top pad, the second top pad interconnector, the fourth top pad, and the fourth conducting member establish a meander current path, from the first base pad to the fourth base pad, within a reference plane normal to a plane of the given base pad support surface.

8. The 3D inductor of claim 7, wherein the height and the pitch of the first conducting member, the second conducting member, the third conducting member and the fourth conducting member are configured wherein the meander current path establishes an inductor approximating a meander inductor having four arms with an arm length corresponding to the height and an arm spacing corresponding to the pitch.

9. The 3D inductor of claim 8, wherein the first conducting member is a metal first pillar, the second conducting member is a metal second pillar, the third conducting member is a metal third pillar, and the fourth conducting member is a metal fourth pillar.

10. The 3D inductor of claim 9, wherein the metal first pillar, the metal second pillar, the metal third pillar, and the metal fourth pillar are formed of copper.

11. The 3D inductor of claim 6, wherein the first conducting member is a first solder ball, having a base that is solder bonded to the first base pad, and a top that is solder bonded to the first top pad, the second conducting member is a second solder ball, having a base that is solder bonded to the second base pad, and a top that is solder bonded to the second top pad, the third conducting member is a third solder ball, having a base that is solder bonded to the third base pad, and a top that is solder bonded to the third top pad, and the fourth conducting member is a fourth solder ball, having a base that is solder bonded to the fourth base pad, and a top that is solder bonded to the fourth top pad.

12. The 3D inductor of claim 11, wherein the first solder ball, the first top pad, the first top pad interconnector, the second solder ball, the second base pad, the base pad interconnector, the third base pad, the third solder ball, the third top pad, the second top pad interconnector, the fourth top pad, and the fourth solder ball establish a meander current path, from the first base pad to the fourth base pad, within a reference plane normal to a plane of the given base pad support surface.

13. The 3D inductor of claim 12, wherein the height of the first solder ball, the second solder ball, the third solder ball and the fourth solder ball, and the pitch are configured wherein the meander current path establishes an inductor approximating a meander inductor having four arms with an arm length corresponding to the height and an arm spacing corresponding to the pitch.

14. The 3D inductor of claim 13, further comprising:
   a lower substrate having a top surface including the given base pad support surface; and
   a top support structure having a bottom surface including the given top pad support surface.

15. The 3D inductor of claim 6, wherein the base pad interconnector is a first base pad interconnector, wherein the 3D inductor further comprises:
   a fifth base pad and a sixth base pad on the given base pad support surface, the fifth base pad and the sixth base pad aligned along the linear axis, and the fourth base pad, the fifth base pad, and the sixth base pad spaced apart by the pitch;
   a fifth conducting member, aligned with and coupled to the fifth base pad, and a sixth conducting member aligned with and coupled to the sixth base pad, the fifth conducting member and the sixth conducting member having the height;
   a fifth top pad on the given top pad support surface, aligned with and coupled to a top of the fifth conducting member, and a sixth top pad on the given top pad support surface, aligned with and coupled to a top of the sixth conducting member;
   a second base pad interconnector on the given base pad support surface, coupling the fourth base pad to the fifth base pad; and
   a third top pad interconnector on the given top pad support surface, coupling the fifth top pad to the sixth top pad.

16. The 3D inductor of claim 15, wherein the first conducting member, the first top pad, the first top pad interconnector, the second conducting member, the second base pad, the first base pad interconnector, the third base pad, the third conducting member, the third top pad, the second top pad interconnector, the fourth top pad, and the fourth conducting member, the second base pad interconnector, the fifth conducting member, the third top pad interconnector, the sixth top pad, and the sixth conducting member establish a meander current path, from the first base pad to the sixth base pad, within a reference plane normal to a plane of the given base pad support surface.

17. The 3D inductor of claim 16, wherein the height and the pitch of the first conducting member, the second conducting member, the third conducting member, the fourth conducting member, the fifth conducting member and the sixth conducting member are configured wherein the meander current path establishes an inductor approximating a meander inductor having six arms with an arm length corresponding to the height and an arm spacing corresponding to the pitch.

18. The 3D inductor of claim 16, wherein the height and the pitch of the first conducting member, the second conducting member, the third conducting member, the fourth conducting member, the fifth conducting member and the sixth conducting member are configured wherein the meander current path establishes an inductor approximating a 3-turn meander inductor that has an arm length corresponding to the height and an arm spacing corresponding to the pitch.

19. The 3D inductor of claim 16, wherein the first conducting member is a metal first pillar, the second conducting member is a metal second pillar, the third conducting member is a metal third pillar, the fourth conducting member is a metal fourth pillar, the fifth conducting member is a metal fifth pillar, and the sixth conducting member is a metal sixth pillar.

20. The 3D inductor of claim 19, wherein the height and the pitch of the metal first pillar, the metal second pillar, the metal third pillar, the metal fourth pillar, the metal fifth pillar and the metal sixth pillar are configured wherein the meander current path establishes an inductor approximating a meander inductor having six arms with an arm length corresponding to the height and an arm spacing corresponding to the pitch.

21. The 3D inductor of claim 19, wherein the metal first pillar, the metal second pillar, the metal third pillar, the metal fourth pillar, the metal fifth pillar, and the metal sixth pillar are formed of copper.

22. The 3D inductor of claim 15, further comprising:
   a lower substrate having a top surface including the given base pad support surface; and
   a top support structure have a bottom surface including the given top pad support surface.

23. The 3D inductor of claim 22, wherein the top support structure comprises an integrated circuit (IC) chip supported in a flip-chip configuration by the lower substrate, the IC chip having a bottom surface including the given top pad support surface.

* * * * *